United States Patent
Ukawa

(10) Patent No.: US 9,634,213 B2
(45) Date of Patent: Apr. 25, 2017

(54) LIGHT EMITTING DEVICE HAVING DUAL SEALING RESINS

(71) Applicant: NICHIA CORPORATION, Anan-shi, Tokushima (JP)

(72) Inventor: Hiroaki Ukawa, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/855,030

(22) Filed: Sep. 15, 2015

(65) Prior Publication Data
US 2016/0005942 A1 Jan. 7, 2016

Related U.S. Application Data

(62) Division of application No. 14/228,767, filed on Mar. 28, 2014, now Pat. No. 9,172,013.

(30) Foreign Application Priority Data

Mar. 29, 2013 (JP) .................................. 2013-073661
Mar. 24, 2014 (JP) .................................. 2014-059728

(51) Int. Cl.
*H01L 33/62* (2010.01)
*H01L 33/00* (2010.01)
(Continued)

(52) U.S. Cl.
CPC ............ *H01L 33/62* (2013.01); *H01L 33/505* (2013.01); *H01L 33/507* (2013.01); *H01L 33/52* (2013.01);
(Continued)

(58) Field of Classification Search
CPC ... H01L 33/502; H01L 33/504; H01L 33/505; H01L 33/52; H01L 33/54; H01L 33/56; H01L 33/62; F21Y 2115/10
See application file for complete search history.

(56) References Cited

U.S. PATENT DOCUMENTS

| 2003/0141510 | A1 | 7/2003 | Brunner et al. |
| 2007/0096113 | A1* | 5/2007 | Inoshita ............... H01L 33/507 257/79 |
| 2011/0222299 | A1* | 9/2011 | Takahashi ............ H01L 33/486 362/363 |
| 2013/0009292 | A1* | 1/2013 | Kawasaki ........... H01L 23/3107 257/666 |

(Continued)

FOREIGN PATENT DOCUMENTS

| EP | 1901348 A2 | 3/2008 |
| JP | 2003-532299 A | 10/2003 |

(Continued)

OTHER PUBLICATIONS

Extended European Search Report in EP Application No. 14162103.7 dated Jul. 15, 2014.

*Primary Examiner* — Pamela E Perkins
(74) *Attorney, Agent, or Firm* — Foley & Lardner LLP

(57) ABSTRACT

Provided is a light emitting device with improved light extracting efficiency and further higher heat releasing performance. A light emitting device includes a planar lead frame having a first lead and a second lead, and includes a light emitting element mounted on the first lead, a resin frame surrounding a periphery of the light emitting element, a first sealing resin filled in the inner side of the resin frame and sealing the light emitting element, and a second sealing resin covering the resin frame and the first sealing resin. Lower end of inner surface of the resin frame is arranged only on the first lead, and at an outside of the resin frame, and the second resin member covers at least a part of the first lead and the second lead. Of the back-surface of the first lead, a region directly under the blight emitting element is exposed.

20 Claims, 16 Drawing Sheets

(51) Int. Cl.
  *H01L 23/495* (2006.01)
  *H01L 33/52* (2010.01)
  *H01L 33/54* (2010.01)
  *H01L 33/50* (2010.01)
  *H01L 33/58* (2010.01)
  *H01L 33/56* (2010.01)
  *H01L 33/48* (2010.01)

(52) U.S. Cl.
  CPC .............. *H01L 33/54* (2013.01); *H01L 33/56* (2013.01); *H01L 33/58* (2013.01); *H01L 33/486* (2013.01); *H01L 2224/45144* (2013.01); *H01L 2224/48091* (2013.01); *H01L 2224/48137* (2013.01); *H01L 2224/48139* (2013.01); *H01L 2224/48247* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

| | | | |
|---|---|---|---|
| 2014/0021503 A1* | 1/2014 | Yoshida | H01L 33/641 257/98 |
| 2014/0042472 A1* | 2/2014 | Kobayashi | H01L 33/56 257/98 |
| 2015/0129908 A1 | 5/2015 | Kobayakawa et al. | |

FOREIGN PATENT DOCUMENTS

| | | |
|---|---|---|
| JP | 2007-281218 A | 10/2007 |
| JP | 2011-009298 A | 1/2011 |
| JP | 2011-216875 A | 10/2011 |
| JP | 2011-238902 A | 11/2011 |
| JP | 2012-504341 A | 2/2012 |
| JP | 2012-160625 A | 8/2012 |
| WO | WO-2010/039546 A1 | 4/2010 |

* cited by examiner

LIGHT EMITTING DEVICE HAVING DUAL SEALING RESINS

CROSS-REFERENCE TO RELATED APPLICATIONS

This application is a divisional of U.S. Ser. No. 14/228,767, filed Mar. 28, 2014, which claims priority to Japanese Patent Application No. 2013-073661, filed Mar. 29, 2013, and Japanese Patent Application No. 2014-059728, filed Mar. 24, 2014. The entire disclosures of these applications are hereby incorporated herein by reference.

BACKGROUND

1. Technical Field

The present disclosure relates to a light emitting device applicable, for example, to purposes such as an indicator, a lighting luminaire, a display, and a backlight light source for liquid crystal display.

2. Background Art

Light emitting devices using light emitting elements such as light emitting diodes or laser diodes are employed in various fields such as general lighting such as in-door lighting, on-vehicle lighting, and backlight for liquid crystal displays. Requirements for higher performance in those light emitting devices are growing daily, and light emitting diodes of further higher output (higher luminance) and lower cost are demanded. Light emitting diodes in various color tones are required according to recent applications, and moreover, the range of color tone is very narrowly limited. In some cases light emitting diodes are used in combination with lenses of secondary optical system, etc., and light emitting diodes which have compatibility with lenses of secondary optical system are also required.

In order to realize white light emitting diodes, light emitting devices which employ combinations of blue light emitting diodes and yellow fluorescent materials (for example, YAG fluorescent materials) have been in use. This may be obtained by injecting a mixture of a resin and a fluorescent material in a region where a light emitting element is mounted.

After mounting a light emitting element, the resin to seal the light emitting element is generally injected in a recess where the light emitting element is mounted. Such recess is formed by, for example, processing a recess in a lead frame, or defined in a resin package which is integrally molded with a lead frame, etc., typically formed by way of mold processing, so that recesses of a relatively uniform shape and size can be manufactured.

See Patent Literature 1: JP 2011-216875A.
See Patent Literature 2: JP 2012-504341A.
See Patent Literature 3: JP 2011-009298A.

However, a disadvantaged resin package type light emitting device which is integrally molded with the lead frame may include a gap (P-N gap) which occurs between the lead frame components in its light emitting portion, which may result in absorption of light emitted from the light emitting element at the P-N gap.

SUMMARY

The present invention is conceived in view of the above circumstances, and an object of the present invention is to provide a light emitting device which can provide further improvement in the light extraction efficiency and has higher heat dissipation efficiency.

In order to solve the problems described above, a light emitting device according to example embodiments of the present invention includes a planar lead frame having a first lead and a second lead, and includes a light emitting element mounted on the first lead, a resin frame surrounding a periphery of the light emitting element, a first sealing resin filled in an inner side of the resin frame and sealing the light emitting element, and a second sealing resin covering the resin frame and the first sealing resin. Lower end of inner surface of the resin frame is arranged only on the first lead, and at an outside of the resin frame, the second resin member respectively covers at least a portion of the first lead and at least a portion of the second lead. Of the back-surface of the first lead, a region directly under the light emitting element is exposed.

Alight emitting device according to the disclosure can provide higher light extraction efficiency and heat releasing property.

DETAILED DESCRIPTION OF THE EMBODIMENTS

Figure 1A:
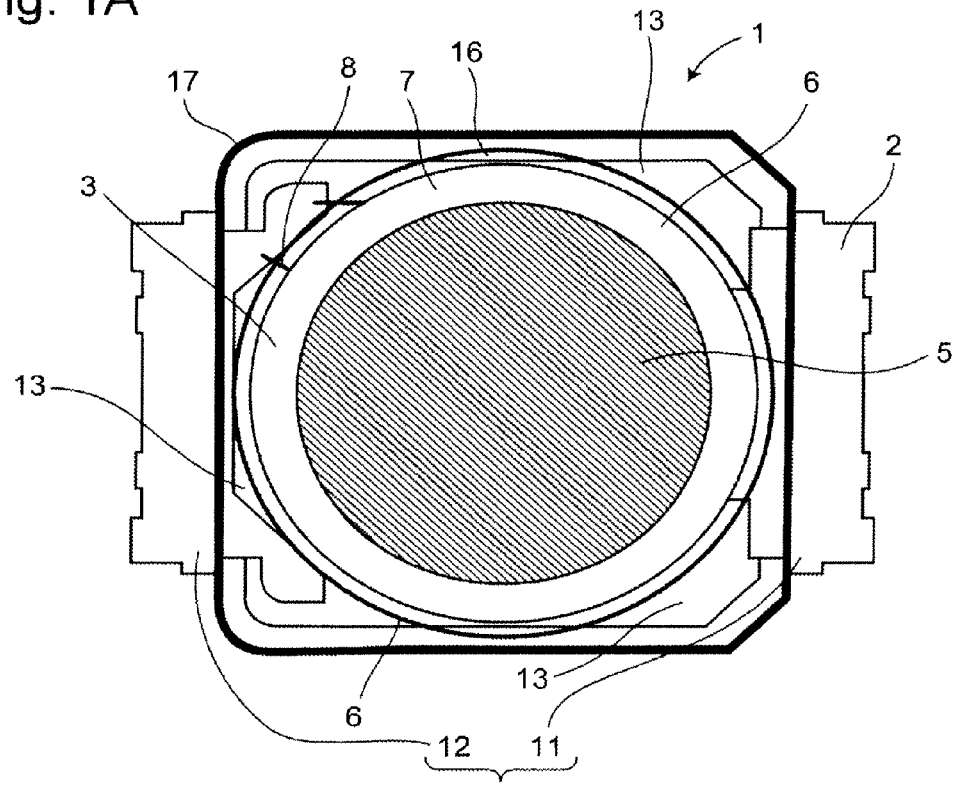
FIG. 1A is a top view of a light emitting device using a molded resin member according to an embodiment of the present invention.

Embodiments of the present invention will be described in detail below with reference to the accompanying drawings. The embodiments are intended as illustrative of a light emitting device to give a concrete form to technical ideas of the present invention, and the scope of the invention is not limited to those described below. The sizes, materials, shapes and the relative arrangements of the members described in the embodiments are given as an example and not as a limitation to the scope of the invention unless specifically stated. The sizes and the positional relationships of the members in each of the drawings are occasionally shown exaggerated for ease of explanation. In the following, terms indicating a specific direction or a position (for example, "upper", "below", "right", "left", "front", and "back" and other terms including those terms) may be used in the following when it is appropriate. But the use of these terms is for the ease of understanding of the present invention with reference to the accompanying drawings, and the scope of the present invention is not to be limited by the commonly accepted definitions of such terms.

FIGS. 1A-B and 2A-B are schematic views each showing a light emitting device 1 according to example embodiments of the present invention. The light emitting device 1 according to the present embodiment includes, as shown in FIGS. 1A-B, 2A-B, a planar lead frame 2 which includes a first lead 11 and a second lead 12. The light emitting device 1 includes a light emitting element 4 mounted on the first lead 11, a resin frame 3 surrounding the periphery of the light emitting element 4, a first sealing resin 5 which is filled in the resin frame 3 to seal the light emitting element 4, and a second sealing resin 6 which covers the resin frame 3 and the first sealing resin 5. The lower end of the inner surface 20 of the resin frame 3 is arranged only on the first lead 11. The second sealing resin 6 covers, at outside of the resin frame 3, at least a part of the first lead 11 and a part of the second lead 12. Of the back-surface of the first lead 11, a region directly under the light emitting element 4 is exposed. In a technique to form a recess of a light emitting device by using a conventional mold processing, in order to change the planar dimension and/or depth of the recess, a mold itself is needed to be remodeled, so that the planar dimension, the depth, or the like of the recess is not a flexible task But employing such a light emitting device as described above allows adjustment of the planar dimension, the depth, etc., of the light emitting devices. In the specification, the term "light emitting portion" refers to a region where a light emitting element is mounted on the lead frame and a resin which seals the light emitting element is disposed. In the present specification, the term "planar shape" is not intended to indicate a perfectly flat plate-shape, and may include a surface with minute uneven texture. A planar shape as a whole may be sufficient and, for example, a smoothness determined by arithmetic average roughness is not specifically required.

Each constituent component of the light emitting device 1 according to example embodiments of the present invention will be described in detail below.

(Resin Frame)

In the light emitting device 1 according to example embodiments of the present invention, the resin frame 3 is disposed surrounding the periphery of the light emitting element 4 mounted on the first lead 11. The region surrounded by the resin frame 3 is filled with a sealing resin (first sealing resin 5) to form the light emitting portion. The resin frame 3 is formed to surround the light emitting element 4, so that the resin frame 3 serves to hold the sealing resin (uncured state of the first sealing resin 5) within the light emitting portion. The resin frame 3 is formed by arranging an uncured raw material of the resin frame 3 in a region to form the resin frame 3 in a desired shape, and hardening the raw material.

Examples of a light emitting portion of a light emitting device include a lead frame processed to define a recess, and a resin package which is integrally molded with a lead frame, and those are formed, for example, by way of mold processing. Thus, in order to change the planar dimension, the height, the width, etc., of the light emitting portion, the mold it self may be needed to be remade. Further, in the case of processing a recess in a lead frame, a margin for pressing is needed at the time of forming a recess, which may increase the size of the light emitting device by the margin for pressing, or reduce the planar dimension for the element mounting portion.

According to example embodiments of the present invention as described above, the resin frame 3 can be formed after mounting a light emitting element on the lead frame, which can facilitate a design change of the planar dimension, the height, the width, etc., of the light emitting portion. Thus, according to example embodiments of the present invention, light emitting devices of high productivity can be provided.

Also, according to example embodiments of the present invention, the recess is not defined in the lead frame by processing a mold, so that a need for the margin for pressing can be eliminated, and thus the size of the light emitting device 1 can be reduced or the planar dimension of the light emitting portion can be increased by the width of the margin for pressing. That is, in order to define a recess of the lead frame, a margin for pressing with a sufficient width is needed at the time of press-working. In the case of the light emitting device 1 according to example embodiments of the present invention, a margin for pressing is not needed. Accordingly, as described above, a reduction in the size of the light emitting device 1 or an increase in the planar dimension of the light emitting portion by the width of the margin for pressing can be achieved.

In embodiments of the present invention, the lower end of the inner surface 20 of the resin frame 3 is may be arranged only on the first lead 11. In the specification, the expression "the lower end of the inner surface 20 of the resin frame 3 is arranged only on the first lead 11" refers that the entire lower end (the entire periphery of the lower end) of the inner surface 20 of the resin frame 3 is located on the first lead 11 and is not present on the second lead 12. According to the structure described above, the lower end of the inner surface 20 of the resin frame 3 is arranged only on the first lead 11, so that only the lead frame (first lead 11) having high reflectance is exposed at the inner side of the resin frame 3, and thus the light emitting efficiency of the light emitting device can be improved.

In this case, the lower end of the outer surface 21 of the resin frame 3 is not needed to be on the first lead 11 and may be present on the second lead 12, as long as the entire lower end of the inner surface 20 of the resin frame 3 is formed on the first lead 11. The lower end of the outer surface 21 of the resin frame 3 may be located on the first lead 11. For example, in the case where the molded resin 13 is arranged between the first lead 11 and the second lead 12, the resin frame 3 can be formed such that the lower end of the inner surface 20 of the resin frame 3 is arranged on the first lead 11 while the lower end of the outer surface 21 of the resin frame 3 is arranged on the molded resin 13 or the second lead 12. On the other hand, in an embodiment where the molded resin 13 is not arranged between the first lead 11 and the second lead 12, the absence of the molded resin 13 between the first lead 11 and the second lead 12 may lead the resin frame 3 to flow out between the first lead 11 and the second lead 12. Thus, both the lower end of the inner surface 20 of the resin frame 3 and the lower end of the outer surface 21 are preferably arranged on the first lead 11.

In one example frame insertion type light emitting device, a gap (hereinafter may referred to as a "P-N gap") between the lead frame components is located in the light emitting portion, which may result in absorption of light emitted from the light emitting element 4 at the P-N gap. Further, generally the light emitting element 4 is not mounted over the P-N gap and which limits available locations for mounting the light emitting element 4 in the light emitting device. However, in a light emitting device according to example embodiments of the present invention, the lower end of the inner surface 20 of the resin frame 3 is arranged only on the first lead 11 and the P-N gap is not arranged in the inner bottom surface of the resin frame 3. Thus, on the bottom surface, the mounting location for the light emitting element 4 is not limited and the light emitting element 4 can be mounted in the vicinity of the center of the light emitting device. With this arrangement, a light emitting device with further higher light extraction efficiency becomes possible.

Also, in the case where both the lower end of the inner surface 20 and the lower end of the outer surface 21 of the resin frame 3 are present only on the first lead 11 (that is in the case where the entirety of the resin frame 3 is arranged only on the first lead), detachment of the resin frame 3 due to the movements of the first lead 11 and the second lead 12 in different directions, can be avoided. That is, for example, in the case where a molded resin 13 is disposed between the first lead 11 and the second lead 12 and the resin frame 3 is arranged spanning the first lead 11 and the second lead 12, the first lead 11 and the second lead 12 may be pulled in different directions due to the thermal expansion of the second sealing resin (lens resin). In this case, the interfaces of the resin frame 3 with the first lead 11 or the second lead 12 may be subjected to forces in different direction, which may result in detachment of the resin frame 3 from the first lead 11 or the second lead 12 or the both. However, in the configuration described above, both the lower end 20 and the lower end of the outer surface 21 of the resin frame 3 are located only on the first lead 11 (that is, the entirety of the resin frame 3 is arranged only on the first lead 11. Thus, a state in which the interfaces of the resin frame 3 with the first lead 11 or the second lead 12 may be subjected to force in different directions does not occur, so that probability of the resin frame 3 detaching from the lead frame (first lead 11) is extremely low. According to example embodiments of the present invention, the resin frame 3 is hardly detached from the lead frame (first lead 11), so that a light emitting device with high reliability can be provided.

In the light emitting device 1 according to example embodiments of the present invention, the resin frame 3 can be formed with any resin which allows forming of the resin frame 3 in any desired shape and curing after molding the frame. Examples of such a resin include a thermosetting resin and a photosetting resin. In the case where a thermosetting resin is used as a raw material of the resin frame 3, heat is applied to the raw material to cure the raw material, to form the resin frame 3. In the case where a photosetting resin is used as a raw material of the resin frame 3, light is applied to the raw material to cure the raw material, to form the resin frame 3. Examples of the resin which constitutes the resin frame 3 include a silicone resin and an epoxy resin.

In the light emitting device 1 according to example embodiments of the present invention, in order to increase the reflectance of the light from the light emitting element 4 to increase the light extraction efficiency, the resin frame 3 preferably contains a reflective member such as titanium oxide, aluminum oxide, zirconium oxide, or magnesium oxide. Particularly, titanium oxide may be preferable. Containing titanium oxide in the resin frame 3 allows for significantly high reflectance of light which allows for an improvement of the light extracting efficiency.

In the light emitting device 1 according to example embodiments of the present invention, the light emitting portion is formed with the resin frame, which allows for formation of the light emitting portion in any desirable shape. The resin frame 3 can be formed in various shapes, such as a circular shape, an elliptical shape, a rectangular shape, or a square shape, in a top view. Also, a polygonal shape such as a hexagonal shape or an octagonal shape, or a shape with rounded corners or a shape with a planar curved surface may be employed. The shape of the resin frame 3 in a top view is not limited to those shown above, and any appropriate shape may be employed.

Figure 1B:
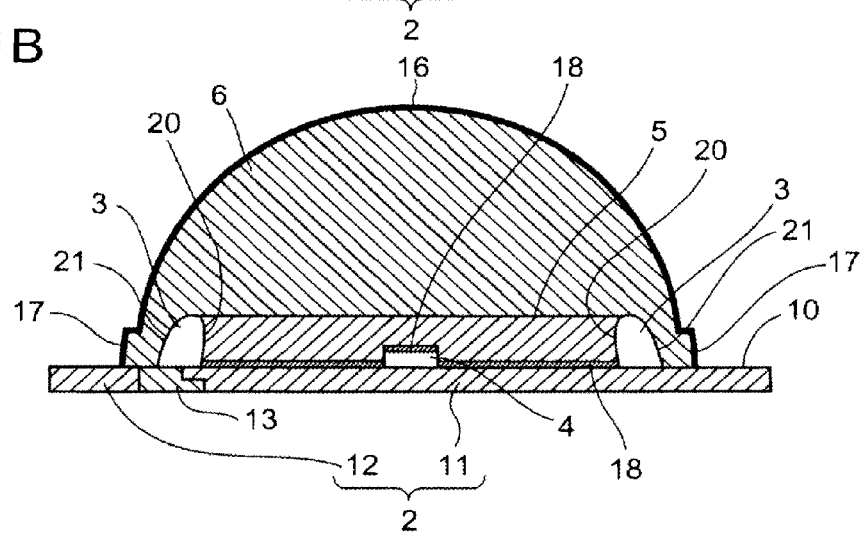
FIG. 1B is a cross-sectional view of FIG. 1A.
Figure 2A:
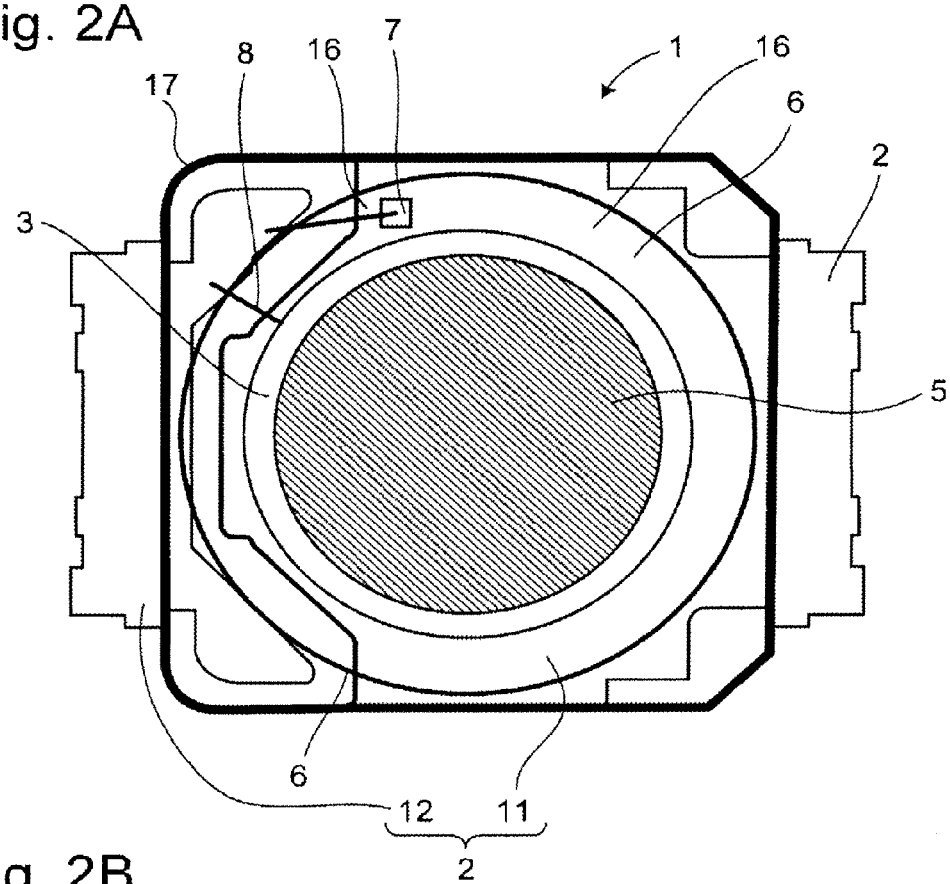
FIG. 2A is a top view of a light emitting device using a molded resin according to another embodiment of the present invention.
Figure 2B:
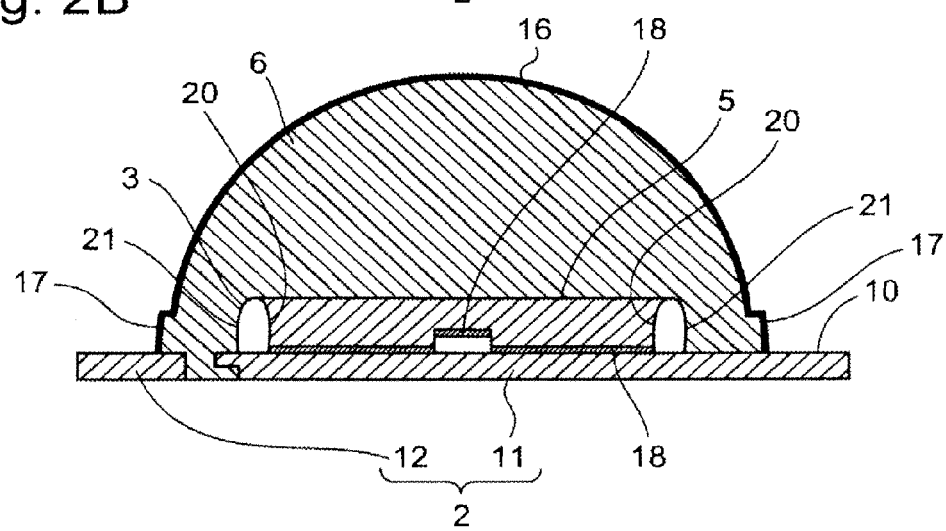
FIG. 2B is a cross-sectional view of FIG. 2A.

The resin frame 3 includes, for example as shown in FIG. 1B and FIG. 2B, a curved inner surface 20 and a curved outer surface 21. The resin frame 3 includes a protruded shape with a rounded tip in a cross section which includes the central axis of the resin frame 3. The resin frame 3 having a curved inner surface 20 and a curved outer surface 21 can be formed by using a syringe-like dispenser, supplying a raw material of the resin frame 3 on the lead frame 2 and curing.

The resin frame 3 may be disposed, as shown in FIG. 2B, in a perpendicular direction, or may be disposed, as shown in FIG. 1B, inclined inwardly of the resin frame 3 (that is, in a direction toward the central axis of the resin frame 3). In the case where the inner surface 20 is formed inclined inwardly, for example, in the forming the second sealing resin, to be described below, at the time of transfer molding of the second sealing resin in a lens shape, the resin frame 3 can be prevented from being in contact with the mold for the second sealing resin 6. Further, the inner surface 20 is formed inclined inwardly, so that the fluorescent material contained in the first sealing resin 5 as the wavelength converting member can be suppressed from depositing on the resin frame 3, and accordingly, variance in the light emission can be prevented.

Figure 3:
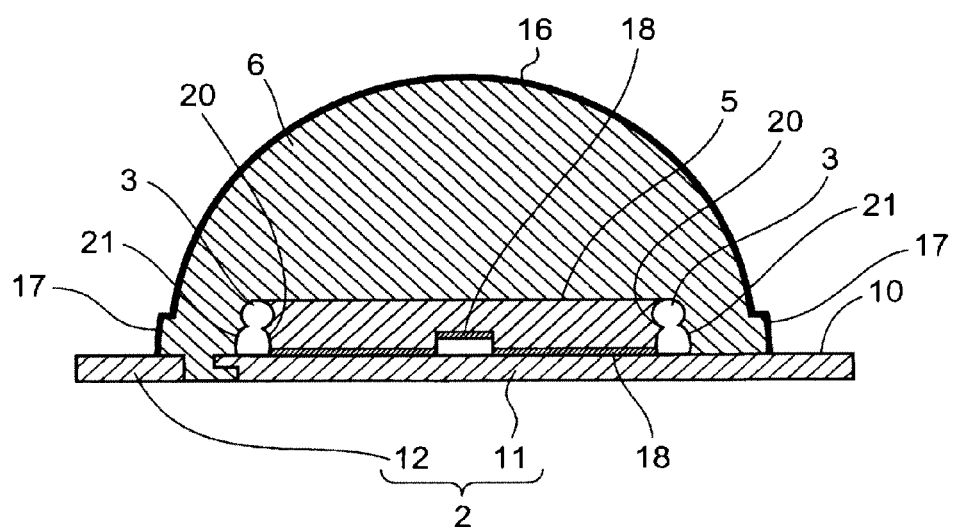
FIG. 3 is a schematic cross-sectional view of a light emitting device according to another embodiment of the present invention.

The resin frame 3 may have a shape, as shown in FIG. 3, in a cross section which includes the central axis of the resin frame 3, in which a semicircular part of a shape is connected to a circular shape, leaving constricted parts at the connecting portions. In this case, the circular portion disposed on the semicircular portion is preferably at an inner side (toward the central axis of the resin frame 3) than the semicircular portion. With this arrangement, in a similar manner as described above, the resin frame 3 is prevented from being in contact with the mold for the second sealing resin 6, which facilitates the manufacturing, and the fluorescent material is suppressed from depositing on the resin frame 3, and thus, variance in the light emission can be prevented. The resin frame 3 having such a cross section can be formed easily by disposing a first level of resin frame with a predetermined size on the first lead 11, and disposing a second level of resin frame with a smaller diameter than the first level of the resin frame on the first level of the resin frame.

In this arrangement, in response to increasing demands for higher output power in the light emitting diodes, increasing the planar dimension of the light emitting portion where the light emitting element to be mounted to increase the light extraction efficiency is one solution. Also, reducing the depth of the recess of the resin injecting portion which contributes to a reduction of absorption of light in the housing such as molded resin, is also one solution to increase the light extraction efficiency. In order to facilitate the combination of the light emitting diodes and lenses of secondary optical system, decreasing the planar dimension of the light emitting portion is one solution. Also, in order to efficiently manufacture light emitting diodes in a narrow range of color tone, the variation in the amount of the fluorescent material injected in the recess is needed to be reduced. For this, increasing the depth of the recess in the resin injecting portion is one solution to reduce the uneven distribution of the amount of the fluorescent material. As described above, the light emitting devices are designed to have, for example, optimum planar dimensions and depths of the light emitting portions respectively with respect to each application, and various specifications are provided according to each application.

However, a disadvantageous light emitting devices with resin packages which are made by mold processing require remodeling of the mold itself to change the planar dimension of light emitting area and/or the depth of the recess of each type of light emitting devices. Changing the molds to meet all those different specifications require labor and time, so that flexible adjustments of the planar dimension and/or the depth of the light emitting portion have been unable to be achieved. In the light emitting device according to example embodiments of the present invention, the light emitting element mounting portion is demarcated by the recess, so that flexible adjustments of the planar dimensions and the depths of the light emitting portions of the light emitting devices become possible.

In the light emitting device 1 according to example embodiments of the present invention, the width and the length of the resin frame 3 are determined based on the planar dimension of the light emitting portion, the planar dimension which allows formation of the sealing resin injection portion, and the mechanical strength, etc., of the resin frame 3. The width and the length of the resin frame 3 can be appropriately adjusted as long as sufficient planar dimensions for the light emitting portion and the sealing resin injecting portion can be secured, and also the mechanical strength of the resin frame 3 can be secured.

The height of the resin frame 3 is determined based on, for example, the mechanical strength of the resin frame 3 and the range of color tone desired for the light emitting device 1. The height of the resin frame 3 can be appropriately adjusted as long as sufficient mechanical strength of the resin frame 3 can be secured and the desired range of color tone can be securely provided.

(Lead Frame)

In the light emitting device 1 according to example embodiments, the lead frame 2 includes a pair of first lead 11 and second lead 12 and may be electrically connected to one or a plurality of elements mounted on the first lead 11. Thus, the lead frame 2 supplies electricity to the light emitting element 4, etc., and also serves as the portion to mount the light emitting element 4, etc. (The term "element" used in the embodiments includes a light emitting element 4, and in the case where the light emitting device 1 includes a protective element 7, it also includes the protective element 7. The elements which includes the light emitting element 4 and the protective element 7 may be referred to as "light emitting elements 4, etc".)

The material of the lead frame 2 is not specifically limited as long as it can serve for mounting the light emitting element 4, and as the electrodes of the light emitting device, but the lead frame 2 is preferably made, for example, of a material which has a relatively great thermal conductivity. Forming with such a material allows the heat generated by the light emitting element 4 to be dissipated more efficiently. For example, a material having a thermal conductivity of about 200 W/(m·K) or greater, a material having relatively high mechanical strength, and/or a material capable of facilitating operations in punching-pressing or etching, is preferably employed. Examples of the material include a metal such as copper, aluminum, gold, silver, tungsten, iron, nickel, or an iron-nickel alloy, phosphor bronze, copper-iron alloy, or those materials with a metal plated layer of silver, aluminum, copper, gold, etc., provided on the surface. The lead frame 2 preferably has a smooth surface to improve the reflectance. The lead frame 2 generally has a uniform thickness, but a thick or thin portion may also be provided.

The overall lead frame 2 is necessary, in one example embodiment, to be made of a metal or an alloy. There also have been light emitting devices in use (for example a Chip On Board (COB) type), in which a wiring pattern is applied by way of metal plating on a surface of a non-electrically conductive member such as a ceramics, and a light emitting element is mounted on the plated metal. However, in such a structure, the light emitting element is disposed over the ceramics, etc, via the plated metal, so that heat generated from the light emitting element is difficult to transmit to the mounting substrate efficiently. On the other hand, as described above, in the case where the entirety of the lead frame 2 is made of a metal or an alloy, due to a high heat conductive property of the metal or alloy, heat generated from the light emitting element 4 can be efficiently transmitted to the mounting substrate through the lead frame 2. Thus, compared to the structure in which a light emitting element is mounted on a ceramic, etc., as described above, more heat can be released from the light emitting element and therefore the light emitting element can be operated stably, which also contributes to a longer operational life.

In the light emitting device 1 according to example embodiments of the present invention, it is preferable that the lead frame 2 has a planar shape and of the back-surface of the first lead 11, a region directly under the light emitting element 4 is exposed. As described above, the lead frame 2 has a planar shape which allows efficient transfer of heat generated at the light emitting element 4 which is mounted on the first lead 11 of the lead frame 2 through the first lead 11 to the mounting substrate which is located under the first lead 11. Thus, heat dissipation properties of the light emitting device 1 can be improved. Also, of the back-surface of the first lead 11, a region directly under the light emitting element 4 is exposed. Thus, heat generated at the light emitting element 4 can be efficiently transferred to the mounting substrate through the exposed region, and in a similar manner as that described above, heat dissipation properties of the light emitting device 1 can be improved. Thus, the lead frame 2 has a planar shape and of the back-surface of the first lead 11, a region directly under the light emitting element 4 is exposed, which allows for provision of the light emitting device 1 with good heat dissipation properties.

Bonding Wire

Generally, a bonding wire 8 is used to electrically connect the lead frame 2 and the light emitting element 4, etc. The bonding wire 8 preferably has a good ohmic contact or a good mechanical contact with an electrode of the semiconductor element 4, or has a good electric conductivity and thermal conductivity. The thermal conductivity is preferably about 0.01 cal/S·cm$^{2}$·° C./cm or higher, and more preferably about 0.5 cal/S·cm$^{2}$·° C./cm or higher. In view of workability, the diameter of the bonding wire 8 is preferably, for example, about 10 μm to about 45 μm. Examples of the material for such bonding wire 8 include a metal such as gold, silver, copper, platinum, and aluminum, and an alloy thereof.

In the light emitting device 1 according to example embodiments of the present invention, the bonding wire 8 which connects the light emitting element 4 and the first lead 11 is connected to the first lead 11 at an inner side of the resin frame 3 or in the resin frame without penetrating the resin frame 3. On the other hand, the bonding wire 8 which connects the light emitting element 4 and the second lead 12 penetrates through the resin frame 3 and is connected to the second lead 12 at the outside of the resin frame 3. A sealing resin is filled in the inner side of the resin frame 3 to form the first sealing resin 5. Thus the bonding wire which connects the light emitting element 4 and the first lead 11 can be protected with the first sealing resin 5. Further, the bonding wire 8 which connects the light emitting element 4 and the second lead 12 is also protected with the first sealing resin 5 and the resin frame 3, so that the bonding wire 8 can be prevented from being loaded with an excess stress. In a light emitting device which has a lead frame formed in a cup shape, the bonding wire is applied over the cup which may result in cutting of the wire due to the bonding wire being in contact with the edge of the cup, but in the light emitting device according to example embodiments of the present invention, the bonding wire 8 penetrates through the resin frame 3, so that the bonding wire 8 can be prevented from being cut by contacting the lead frame. The bonding wire 8 is arranged with respect to the resin frame 3 so that the bonding wire penetrates through the resin frame 3. This arrangement can be obtained by, as described below, the light emitting element 4 and the lead frame 2 being connected with the bonding wire 8, then, the raw material of the resin frame 3 is discharged over the bonding wire 8 to across the bonding wire 8, and the raw material is cured.

Light Emitting Element

For the light emitting element 4, any element which is a semiconductor light emitting element, and so-called light emitting diode can be used. For example, such an element includes, a stacked layer structure which includes a light emitting layer formed on a substrate, a nitride semiconductor such as InN, AlN, GaN, InGaN, AlGaN, InGaAlN, a group III-V compound semiconductor, a group II-VI compound semiconductor or the like.

The emission wavelength of the light emitting element 4 can be changed from ultraviolet region to red, by changing, for example, the materials of the semiconductor, the ratio of mixed crystal, the content of indium in InGaN in the light emitting layer, and kinds of impurity which is doped in the light emitting layer.

Such a light emitting element 4 is mounted on the upper surface (first main surface) 10 of the lead frame 2. In mounting the light emitting element 4 on the upper surface 10 of the lead frame 2, generally, a bonding member is used. For example, in the case of a light emitting element which is constituted with a nitride semiconductor grown on a sapphire substrate and the light emitting element emits blue to green light, an epoxy resin, a silicone, etc., can be used. Without the use of a resin, a solder material such as Au—Sn eutectic, a brazing material such as a low melting point metal may be used. Further, as in a red-emitting light emitting element made of GaAs, etc., a light emitting element having electrodes formed on the both sides, die-bonding may be employed with using a conductive paste such as silver, gold, or palladium. The back-surface of the light emitting element 4 may, for example, be Al-plated.

In the light emitting device 1 according to example embodiments of the present invention, either only a single light emitting element 4 or two or more light emitting elements 4 may be mounted. In the case where a plurality of light emitting elements 4 are mounted, the light emitting elements 4 may be arranged in a square configuration or in other configurations. Mounting the light emitting elements 4 in a square configuration allows a uniform amount of a fluorescent material between the light emitting elements 4, which allows a reduction in irregular distribution of emission color.

Also, the light emitting element 4 may be mounted on the lead frame 2 via a support member (submount). For example, a support member employing a ceramics may be obtained by forming a predetermined shape and then conducting calcination. The upper surface side of the support member may be provided with a conductive wiring which is to be connected to the light emitting element 4. The conductive wiring is, generally, formed by using vapor deposition or sputtering technology, a photolithography process, or by using printing technology, etc., or electrolytic plating, etc. The conductive wiring may be provided in the support member. The conductive wiring is, for example, formed with a material in a paste state of a resin binder containing a high melting point metal such as tungsten and molybdenum. With the use of technology such as screen printing, the material in a paste state may be applied on the surface of a green sheet with filling the through-holes defined in the green sheet, then, firing is performed, and thus, the support member made of ceramics and the conductive wiring arranged on the surface or inside the support member may be formed. The support member may be formed by way of insert molding of a resin, with the use of a pair of positive and negative electrodes as the conductive member. A light emitting element 4 may be mounted on an upper surface of such a support member, and electrically connected to the conductive wiring of the support member. In the case where such a support member is used, the conductive wiring of the support member may be electrically connected to the lead frame 2 to be described below. In this case, the light emitting element 4 may be mounted in a face-down (flip-chip) manner.

In the light emitting device 1 according to example embodiments of the present invention, when the light emitting device 1 is viewed from the light emitting surface side, in order to avoid sulfurization problems, the solder which bonds to the bonding wire 8 is preferably gold. The die-bonding area for mounting the light emitting element 4 may be silver-plated. Other areas are preferably plated with a metal other than silver to prevent sulfurization.

(Sealing Resin)

The first sealing resin 5 may be filled in the resin frame 3 to protect the light emitting element 4. In the light emitting device 1 according to example embodiments of the present invention, after mounting the light emitting element 4 on the lead frame 2, the first sealing resin 5 may be arranged in the inner side of the resin frame 3 to cover the light emitting element 4. The first sealing resin 5 in the resin frame 3 preferably has, for example, the same height as the height of the resin frame 3. In the case where the first sealing resin 5 has a height lower than the height of the resin frame 3, creep-up of the first sealing resin 5 due to surface tension may occur. As described above, arranging the height of the first sealing resin 5 as the same height of the resin frame 3 may allow for prevention of the occurrence of creep-up of the first sealing resin 5. But the first sealing resin 5 and the resin frame 3 do not necessarily have the same height, and the first sealing resin 5 may either be higher or lower than the resin frame 3.

In the light emitting device 1 according to example embodiments of the present invention, the first sealing resin 5 has a refractive index of about 1.5 to about 1.6 in view of the refractive indices of the sapphire substrate (not shown) of the light emitting element 4 and the second sealing resin 6. With this arrangement, the difference between the refractive index of the first sealing resin 5 and the refractive index of the sapphire substrate, and the difference between the refractive index of the first sealing resin 5 and the refractive index of the second sealing resin 6 can be reduced, and the light extracting efficiency of light extracted from the light emitting device 1 can be improved.

The first sealing resin 5 is preferably, for example, made of a material which can protect the light emitting element 4 from external forces, moisture, or the like, and also can protect the bonding wire 8 which provides the connection of the light emitting element 4 and the lead frame 2.

Examples of the first sealing resin 5 include a light transmissive resin having good weather resistance such as an epoxy resin, a silicone resin, an acrylic resin, a urea resin, or a combination of those, or glass. The first sealing member 5 is preferably made of the same material and composition, etc., as of the second sealing resin 6 to be described below, and a light diffusion material or a fluorescent material may be included in the light transmissive member. The use of the same member as in the second sealing member 6 allows for approximately the same thermal expansion coefficient in the second sealing resin 6 and the first sealing resin 5, so that impact resistance against the wire which is arranged over both the second sealing resin 6 and the first sealing resin 5 can be improved. Further, the refractive indices can also be approximately the same, so that loss of light which passes from the first sealing resin 5 to the second sealing resin 6 can be prevented and light extraction efficiency can be improved. The first sealing member 5 may be made of different material, different composition, or the like. In the case where moisture is contained in a resin material for the first sealing resin 5, the moisture contained in the resin can be removed by baking at about 100° C. for about 14 hours or more. Thus, steam explosion and/or detachment between the light emitting element 4 and the first sealing resin 5 can be prevented. The first sealing resin 5 is preferably selected from the materials which have a small difference in the thermal expansion coefficient with other members, in view of adhesion between the second sealing member 6 and the first sealing member 5 affected by the heat generated from the light emitting element 4.

In the light emitting device 1 according to example embodiments of the present invention, the linear expansion coefficient of the first sealing resin 5 is preferably, for example, 200 to 400 ppm/K, and more preferably about 300 ppm/K. Also, the elastic modulus of the sealing resin which constitutes the first sealing resin 5 is preferably, for example, 1 to 3 GPa, and more preferably about 2 GPa.

The first sealing resin 5 may contain a light diffusion material or a wavelength converting member (fluorescent material) 18. The light diffusion material serves to diffuse light, which allows for lowering the directivity of light from the light emitting element 4, so that view angle can be increased. The wavelength converting member 18 serves to convert light from the light emitting element 4, and the wavelength of light emitted from the light emitting element 4 to outside of the first sealing resin 5 can be converted. In the cases where the light from the light emitting element 4 is a visible light of short wavelength with high energy, a perylene derivative which is an organic fluorescent material, inorganic fluorescent materials such as ZnCdS:Cu, YAG:Ce, nitrogen containing $CaO-Al_2O_3-SiO_2$ activated with Eu and/or Cr, or the like, can be appropriately used. In embodiments of the present invention, in the case where a white light to obtain, particularly, with the use of a YAG:Ce fluorescent material, depending on the content of the YAG:Ce fluorescent material, light from a blue light emitting element and a yellow light which is emitted by the fluorescent material upon absorbing a part of the light from the blue light emitting element and converting its wavelength, can generate a desired white light. Thus, a white light can be generated relatively easily with good reliability. Similarly, in the case where nitrogen containing $CaO-Al_2O_3-SiO_2$ fluorescent material activated with Eu and/or Cr is employed, depending on the content thereof, light from a blue light emitting element and a red light which are complimentary colors, emitted by the fluorescent material upon absorbing a part of the light from the blue light emitting element, can generate a white light. Thus, a white light can be generated relatively easily with good reliability.

The wavelength converting member is, as shown in FIG. 1A, FIG. 2A, and FIG. 3, respectively, by a reference numeral 18, deposited in a layer on the upper surface of the light emitting element 4 and on the upper surface of the first lead 11 which is at an inner side of the resin frame 3. Arrangement of the wavelength converting member 18 is not limited on the upper surface of the light emitting element 4 and on the upper surface of the first lead 11 at the inner side of the resin frame 3, but may be contained dispersed in the first sealing resin 5.

(Second Sealing Resin)

In the light emitting device 1 according to example embodiments of the present invention, the second sealing resin 6 may be formed to cover the resin frame 3 and the first sealing resin 5, and also at the outer side of the resin frame 3, to respectively cover at least a portion of the first lead 11 and at least a portion of the second lead 12 of the lead frame 2.

The shape of the second sealing resin 6 can be selected from various shapes. Examples of the shape of the second sealing resin 6 include a plate-like shape, an upper surface with a convex lens shape, an upper surface with a concave lens shape, a Fresnel lens shape, and a convex lens shape with a recess near the center. With such a shape as shown above, the directional characteristics can be adjusted.

Now, a case where the second sealing member 6 has a lens shape will be described in detail below. As shown in FIG. 1B and FIG. 2B, the second sealing resin 6 may include a lens portion formed protruding upward in a lens shape 16 and a flange portion 17 extending from a lower portion of the lens portion 16 outward. With such an arrangement, the second sealing resin 6 may have a lens portion 16 formed in a lens shape, so that the lens portion 16 concentrates the light emitted from the light emitting element 4 and the directivity of the light can be increased.

In the light emitting device 1 according to example embodiments of the present invention, an end of the bonding wire 8 which is connected to the second lead 12 is preferably, for example, arranged in the flange portion 17. As described above, arranging an end of the bonding wire 8 connected to the second lead 12 in the flange portion 17 allows for preventing breakage of the bonding wire 8. It is thought that a smaller amount of the sealing resin is arranged around the bonding wire 8 in the flange portion 17, so that the bonding wire 8 may be hardly affected by the influence of thermal expansion. Also, the bonding wire 8 is not arranged in the lens portion 16, so that absorption of light by the bonding wire 8 can be prevented, which allows for an increase of the light emitting efficiency.

The second sealing resin 6 can be made of any appropriate material which allows extraction of light. Examples of the material which constitutes the second sealing resin 6 include a silicone resin and an epoxy resin.

In the light emitting device 1 according to example embodiments of the present invention, the radius of the second sealing resin 6 can be any appropriate size, as long as, for example, at least a part of the first lead 11 or the second lead 12 can be covered with the second sealing resin 6 at the outside of the resin frame 3. The radius of the second sealing resin 6 is determined appropriately according to the planar dimension of the light emitting portion.

In the light emitting device 1 according to example embodiments of the present invention, the refractive index of the second sealing resin 6 may be any value as long as, for example, the difference in the refractive index between the first sealing resin 5 and the second sealing resin 6, and between the second sealing resin 6 and the atmospheric air, are in an appropriate range. The second sealing resin 6 preferably has a refractive index, for example, of about 1.41. With the refractive index of the second sealing resin 6 in such a range, the difference in the refractive index between the first sealing resin 5 and the second sealing resin 6 can be in an appropriate range and the light extraction efficiency can be improved.

(Molded Resin)

As shown in FIGS. 1A and 1B, a molded resin 13 may be disposed between the first lead (cathode) 11 and the second lead (anode) 12 which are example constituting components of the lead frame 2. As shown above, in an embodiment where the molded resin 13 is disposed between the cathode 11 and the anode 12, a gap is not formed between the cathode 11 and the anode 12, so that uncured raw material of the resin frame 3, the first sealing resin 5, and the second sealing resin 6, can be prevented from flowing out between the cathode 11 and the anode 12. Also, in such a structure, the resin frame 3 may be formed on the boundary between the molded resin 13 and the first lead 11 or the second lead 12, so that the resin frame 3 holds the burr of the molded resin 13, which allows for further improvement in the adhesion between the resin frame 3 and the lead frame 2.

(Protective Element)

In the light emitting devices according to example embodiments of the present invention, in addition to at least one light emitting element, a protective element may also be mounted. Either one or two or more protective elements may be used. The protective element 7 is not specifically limited and any known protective elements in the art may also be used in the light emitting device 1. Examples of the protective elements may include a protective circuit and/or an electrostatic protective element which can block a reverse electric current upon application of reverse voltage to the light emitting element 4, or which can block an excess amount of current to the light emitting element 4 upon application of an excessive voltage which is higher than the operation voltage of the light emitting element 4 and higher than the specified voltage. More specifically, a Zener diode can be used.

In the light emitting device 1 of according to example embodiments of the present invention, the protective element 7 may be preferably arranged outside of the irradiation range of the light emitted from the light emitting element 4. With this arrangement, absorption of light by the protective element 7 can be prevented. More specifically, the protective element 7 may be mounted outside of the resin frame, or may be mounted so that a part or entirety of the protective element is embedded in the resin frame.

(Other Components)

In the light emitting device 1 according to example embodiments of the present invention, in order to efficiently perform extraction of light from the light emitting element 4, various components such as a reflection member, an antireflection member, a light diffusion member, etc., may be provided.

As the reflecting member, a plated layer may be formed on the inner surface of the resin frame 3. The plated layer may be made, for example, of one or more than two of silver, aluminum, copper and gold, etc. The plated layer is preferably constituted, for example, with silver, and the whole plated layer may be made of silver. With this arrangement, an extremely satisfactory light extraction efficiency can be obtained.

(Method of Manufacturing Light Emitting Device)

Example manufacturing steps of a light emitting device 1 according to an example embodiment in which a molded resin 13 is arranged between the lead frame components 2, may be described as follows.

FIGS. 4 to 9 are example diagrams illustrating example manufacturing steps of the light emitting device 1 according to a embodiment in which the molded resin 13 is arranged between the lead frame components 2 (the first lead 11 and the second lead 12). Now, each example manufacturing step will be described in detail below.

(I) Preparing Lead Frame

Figure 4:
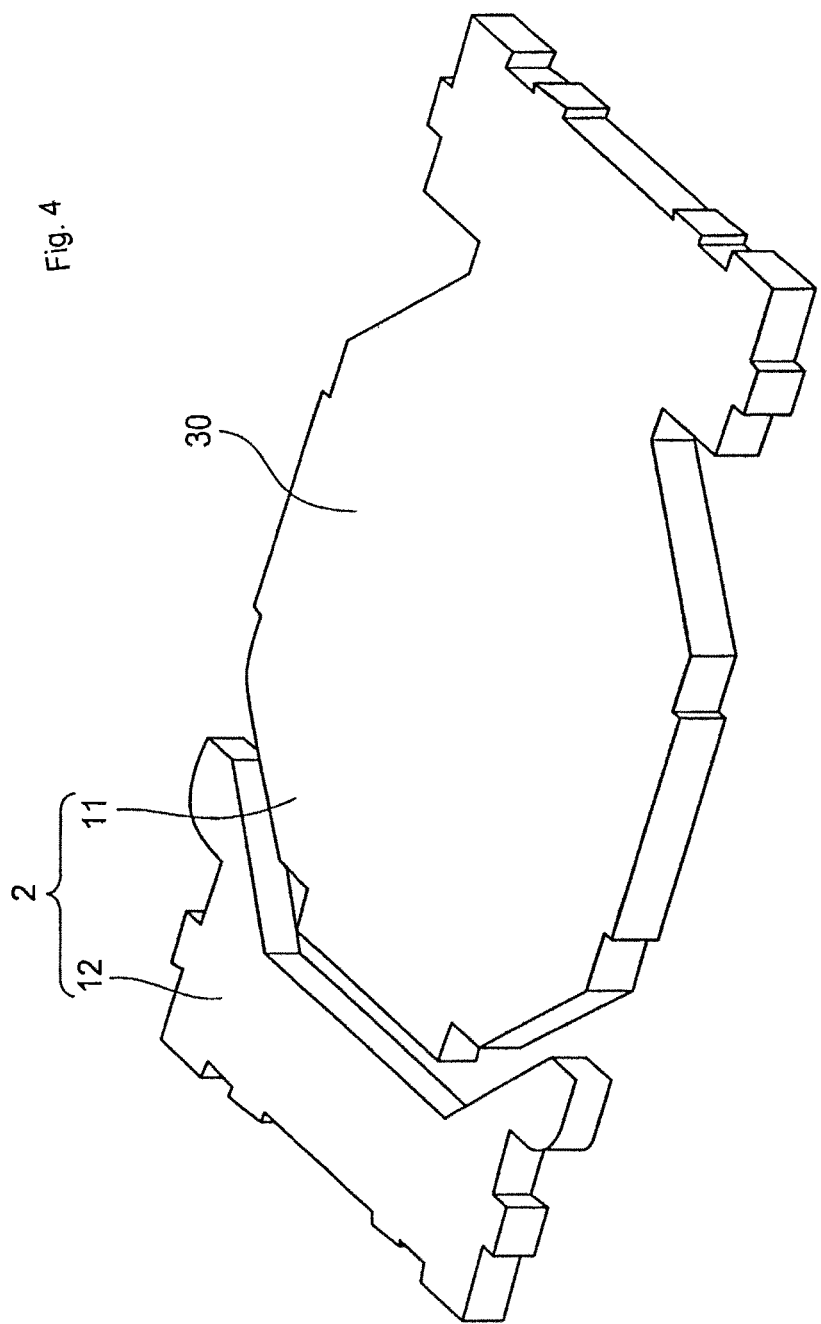
FIG. 4 is a process drawing showing an embodiment of a manufacturing step of preparing a lead frame, in a light emitting device according to an embodiment, arranging a molded resin between the lead frame components.

First, the lead frame 2 as shown in FIG. 4 is prepared. The lead frame 2 may be composed of a first lead (for example, a cathode) 11 and a second lead (for example, an anode) 12, and formed in a planar shape. In the present embodiment, the cathode 11 may be formed larger than the anode 12, and a light emitting element mounting portion 30 on which a light emitting element 4 to be mounted may be formed on the cathode 11.

(II) Forming Molded Resin

Figure 5:
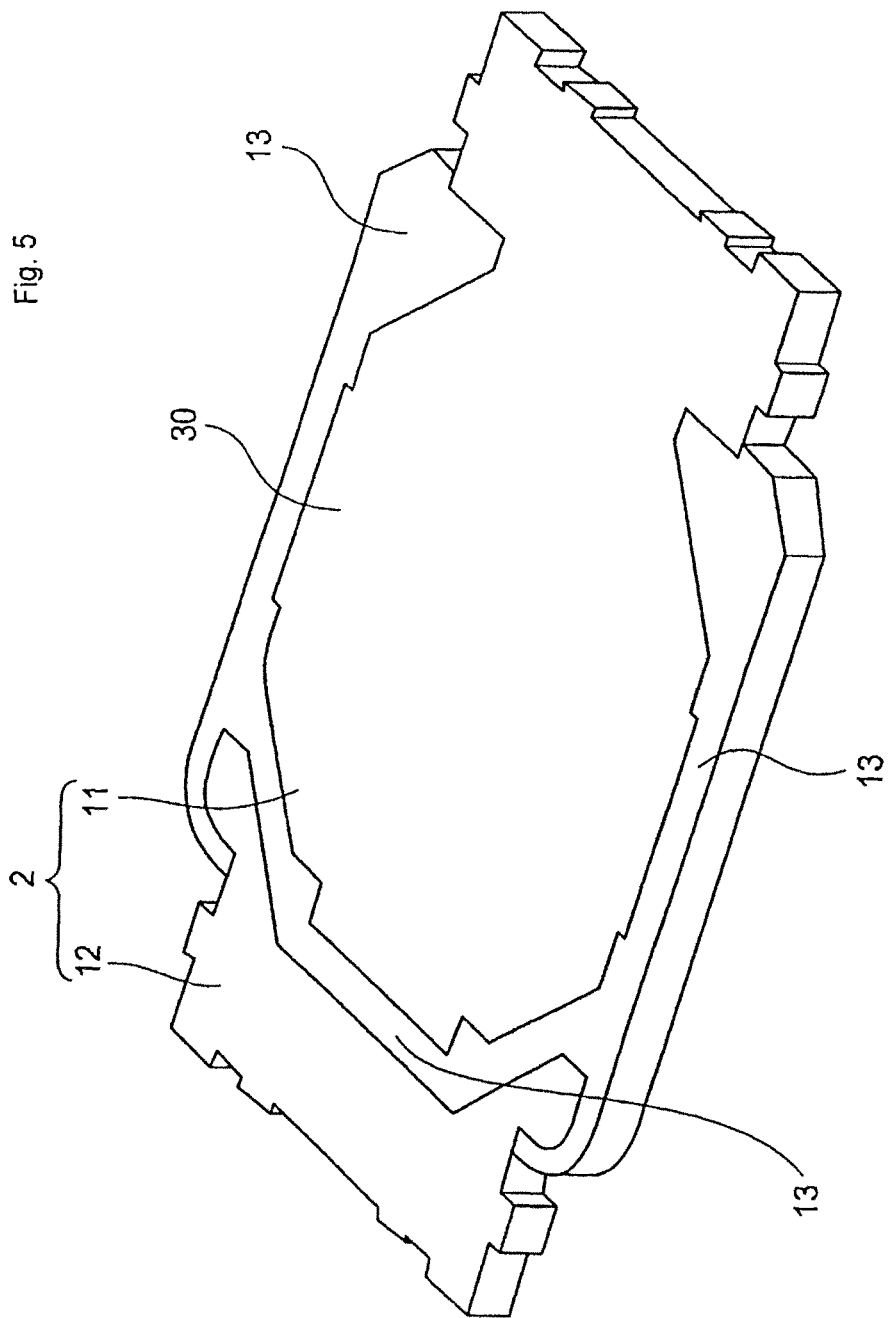
FIG. 5 is a process drawing showing a manufacturing step of the light emitting device according to an embodiment shown above, of arranging a molded resin between the lead frame components.

Then, as shown in FIG. 5, a molded resin 13 may be disposed between the cathode 11 and the anode 12. However, the arrangement of the molded resin 13 is optional, and as described below, the molded resin 13 may (in an example embodiment) not be arranged between the cathode 11 and the anode 12. In the case where the molded resin 13 to be arranged, as shown in FIG. 5, the molded resin 13 is arranged not only between the cathode 11 and the anode 12, but also may be arranged to surround the light emitting element mounting portion 30 of the cathode 11. With such an arrangement, adhesion between the lead frame and the molded resin can be improved, and at the time of forming the resin frame, the planar dimension available for the formation at the interface between the lead frame and the molded resin can be increased, which allows for an improvement in the adhesion between the resin frame and the lead frame. Also, providing an anchor such as a notch at an end surface of the lead frame may allow for higher adhesion with the molded resin.

(III) Mounting Light Emitting Element and Bonding Wire

Figure 6:
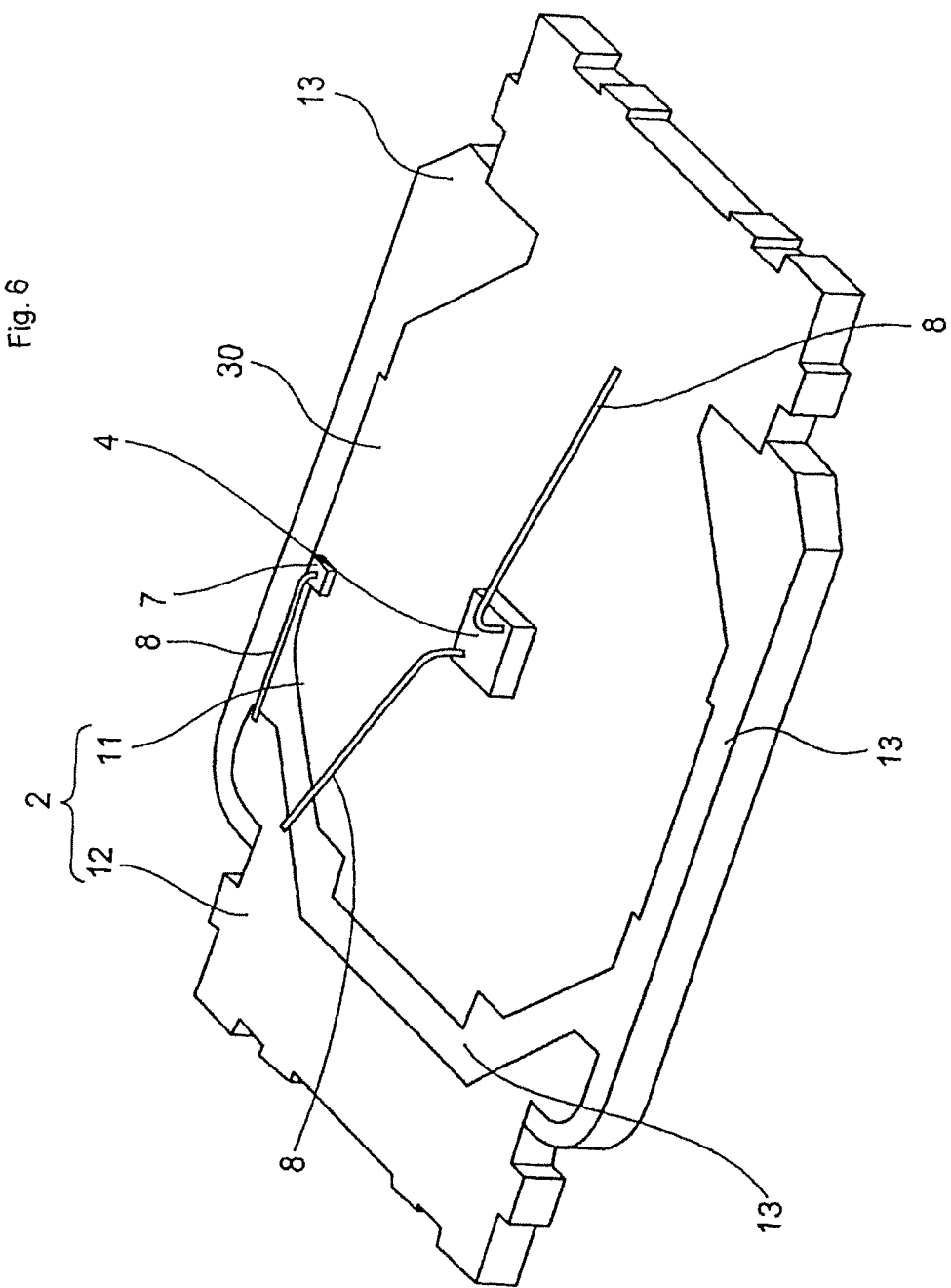
FIG. 6 is a process drawing showing a manufacturing step of the light emitting device according to an embodiment shown above, of disposing a light emitting element on the lead frame, and the lead frame and the light emitting element are electrically connected by way of wire bonding.

As shown in FIG. 6, the light emitting element 4 may be mounted on the light emitting element mounting portion 30 of the cathode 11. At mounting, a bonding member such as an epoxy resin, or a silicone resin as described above, may be used. Then, the light emitting element 4 and the cathode 11 or the anode 12 may be connected with a bonding wire 8.

(IV) Forming Resin Frame

Figure 7:
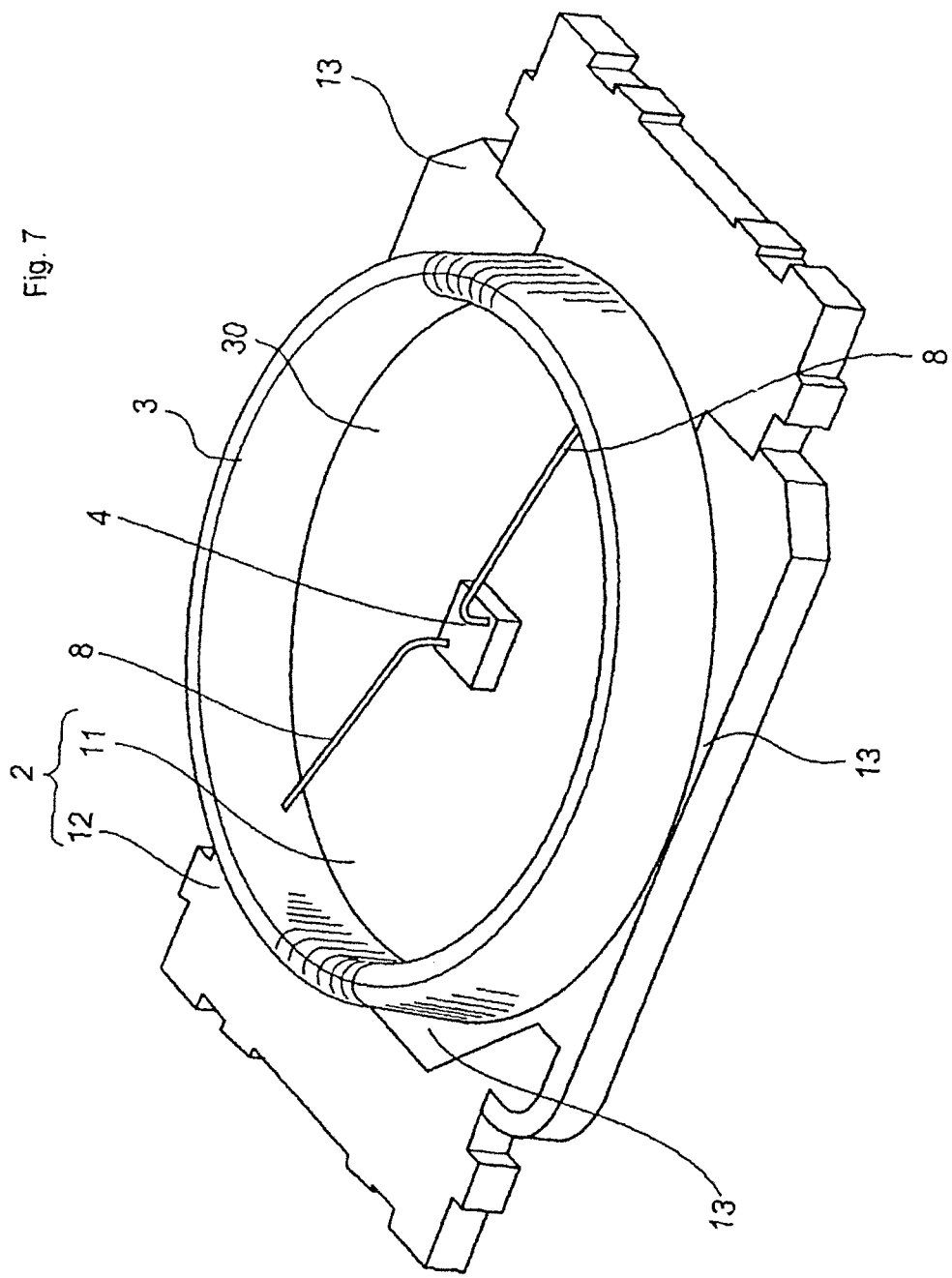
FIG. 7 is a process drawing showing a manufacturing step of the light emitting device according to an embodiment shown above, of forming a resin frame on the lead frame.

Next, as shown in FIG. 7, a raw material of the resin frame 3 is supplied on the cathode 11 to surround the light emitting element 4, to form the frame and may then be cured. At this stage, the resin frame 3 may be formed so that the lower end of the inner surface 20 of the resin frame 3 may be arranged only on the first lead (cathode) 11. Preferably, at the time of forming an uncured frame, a dispenser device which can discharge the raw material of the resin frame 3, for example a syringe-like dispenser (not shown), is moved while discharging the raw material from the dispenser. The amount of the raw material can be adjusted at predetermined locations, so that the thickness and the height of the resin frame 3 can be changed to desired values.

(V) Forming First Sealing Resin

Figure 8:
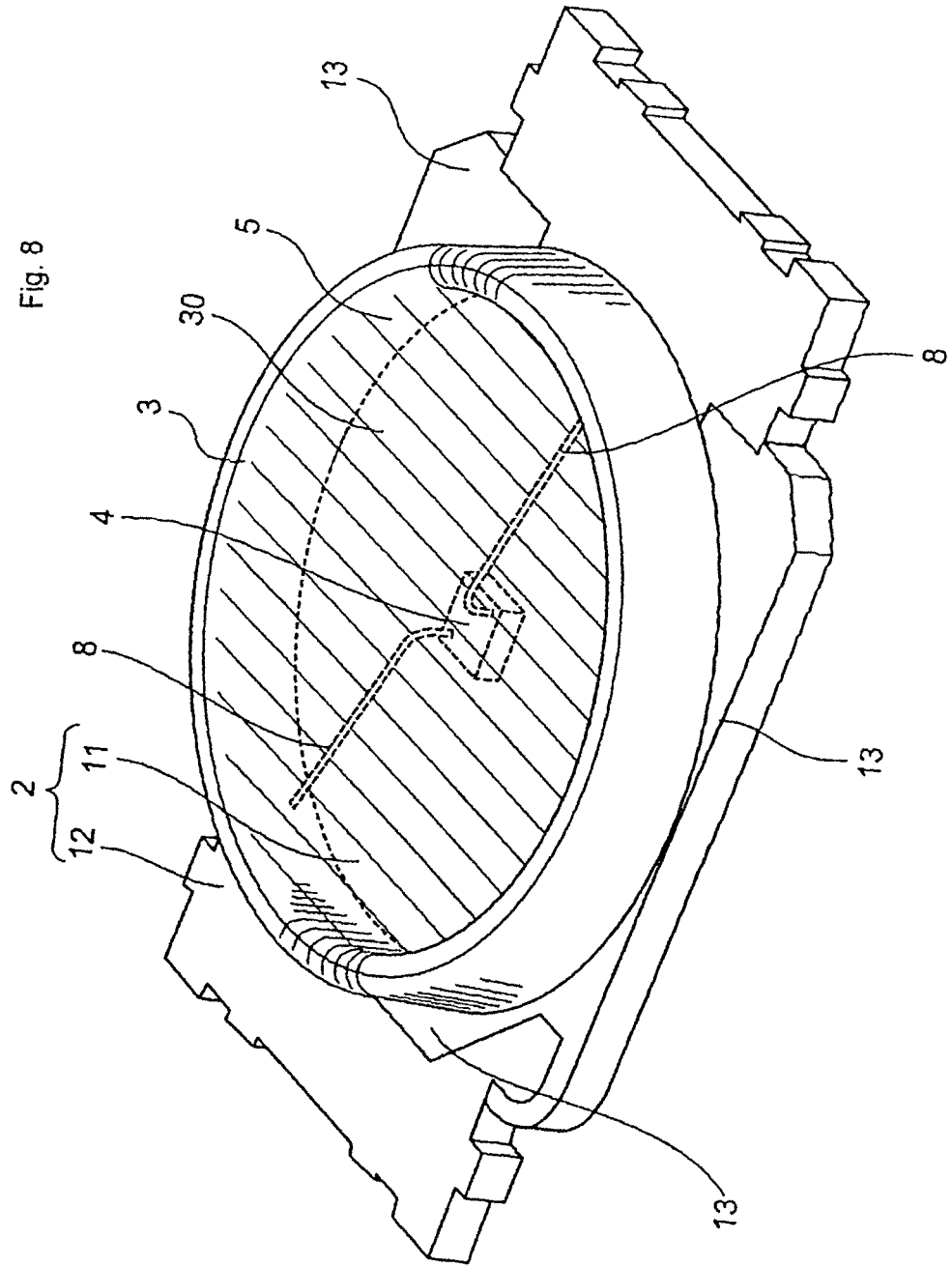
FIG. 8 is a process drawing showing a manufacturing process of the light emitting device according to an embodiment shown above, of forming a first sealing resin by filling a sealing resin in the inner side of the resin frame and hardening.

As shown in FIG. 8, a sealing resin may be filled in the resin frame 3 and cured to form the first sealing resin 5. As described above, the first sealing resin 5 may contain a fluorescent material or the like, for example.

(VI) Forming Second Sealing Resin

Figure 9:
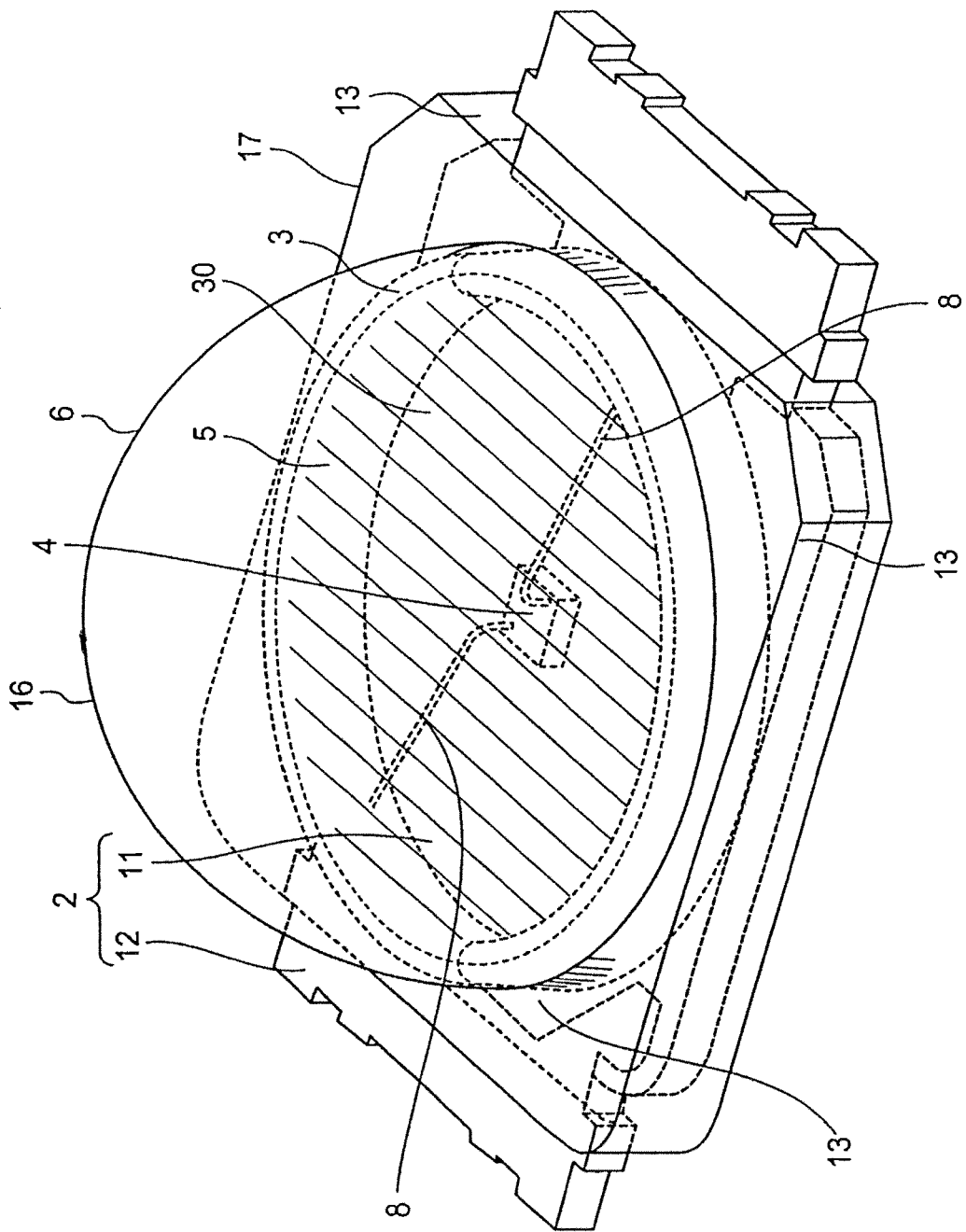
FIG. 9 is a process drawing showing a manufacturing process of the light emitting device according to an embodiment shown above, of forming a second sealing resin to cover the first sealing resin.

As shown in FIG. 9, the second sealing resin 6 may be formed so that the second sealing resin 6 covers the resin frame 3 and the first sealing resin 5, while respectively covering at least a part of the first lead (cathode) 11 and at least a part of the second lead (anode) 12 at outside of the resin frame 3. The second sealing resin 6 is, for example, formed by way of transfer molding. First, on the lead frame 2, an upper mold defining a cavity corresponding to the shape of the second sealing resin 6 (for example a lens shape) may be arranged so that the resin frame 3 and the first sealing resin 5 may be covered with the portion of the mold which defines the cavity, and the lower mold may be arranged to cover the surface of the lead frame 2 where the resin frame 3 and the first sealing resin 5 are not formed. In this stage where the molds are placed, the end the portion of the mold where the cavity is defined may be arranged at outer side of the resin frame 3 so that the resin frame 3 does not come in contact with the portion of the upper mold which defines the cavity. Then, uncured raw material which constitutes the second sealing member 6 may be poured into the cavity, and then cured. According to the example manufacturing steps described above, the light emitting device 1 in which the second sealing resin 6 is formed so that the second sealing resin 6 covers the resin frame 3 and the first sealing resin 5, while respectively covering at least a part of the first lead (cathode) 11 and at least a part of the second lead (anode) 12 at outside of the resin frame 3, can be produced.

Further example manufacturing steps of a light emitting device 1 according to an example embodiment in which a molded resin 13 is not arranged between the constituting components of the lead frame 2, may be described as follows.

FIGS. 10 to 14 are example diagrams illustrating example manufacturing steps of the light emitting device 1 according to an example embodiment in which the molded resin 13 is not arranged between the constituting components of the lead frame 2 (the first lead 11 and the second lead 12).

Now, each example manufacturing step will be described in detail below.

(I) Preparing Lead Frame

Figure 10:
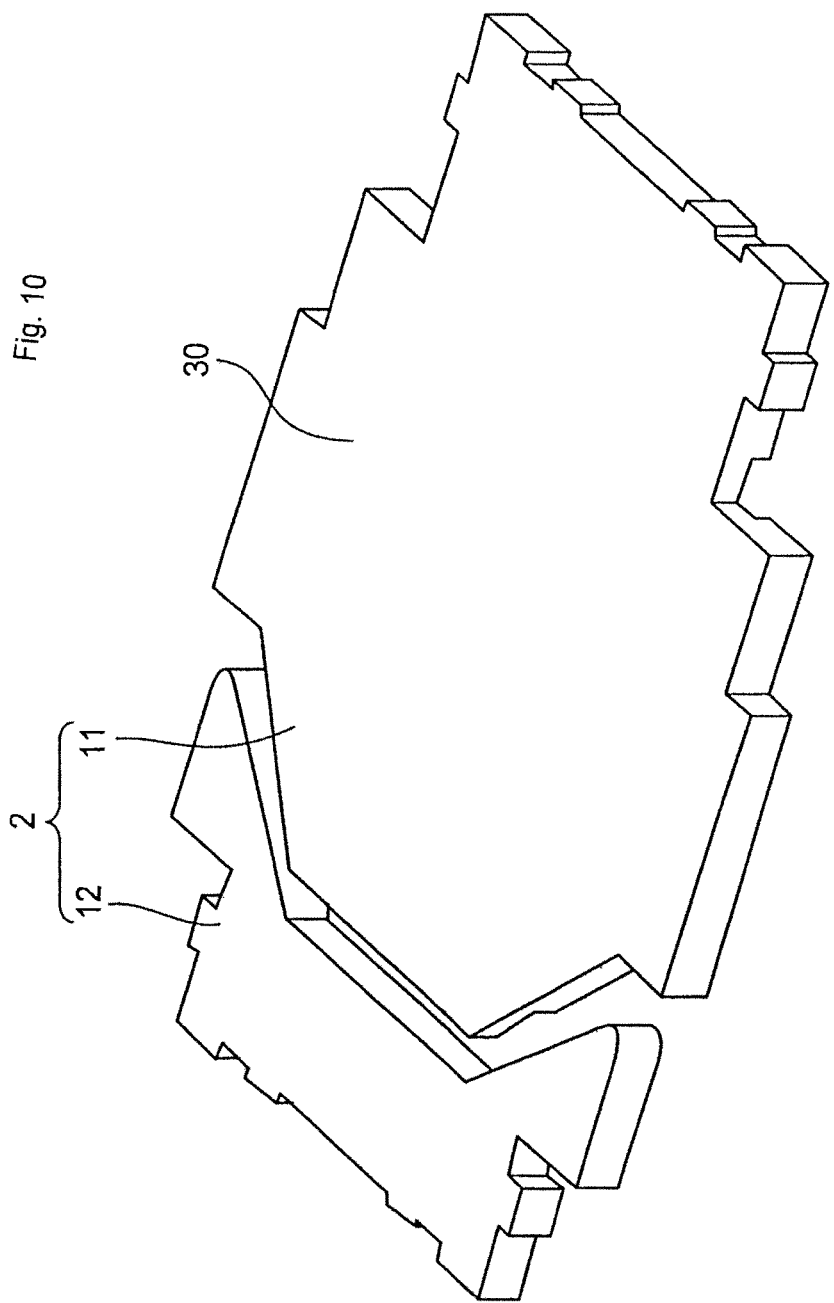
FIG. 10 is a process drawing showing a manufacturing process of preparing a lead frame, in a light emitting device according to an embodiment, in which a molding resin member is not arranged between the lead frame components.

First, the example lead frame 2 as shown in FIG. 10 is prepared. In the present embodiment, the resin frame 3 may be formed so that the lower ends of the inner surface 20 and the outer surface 21 of the resin frame 3 are arranged only on the first lead (cathode) 11. As shown in FIG. 10, the cathode 11 may be formed larger than the anode 12, and a light emitting element mounting portion 30 on which a light emitting element 4 may be disposed, may be formed on the cathode 11. Also, providing an anchor such as a notch at an end surface of the lead frame may allow for higher adhesion with the second sealing resin to be described below.

(II) Mounting Light Emitting Element and Bonding Wire

Figure 11:
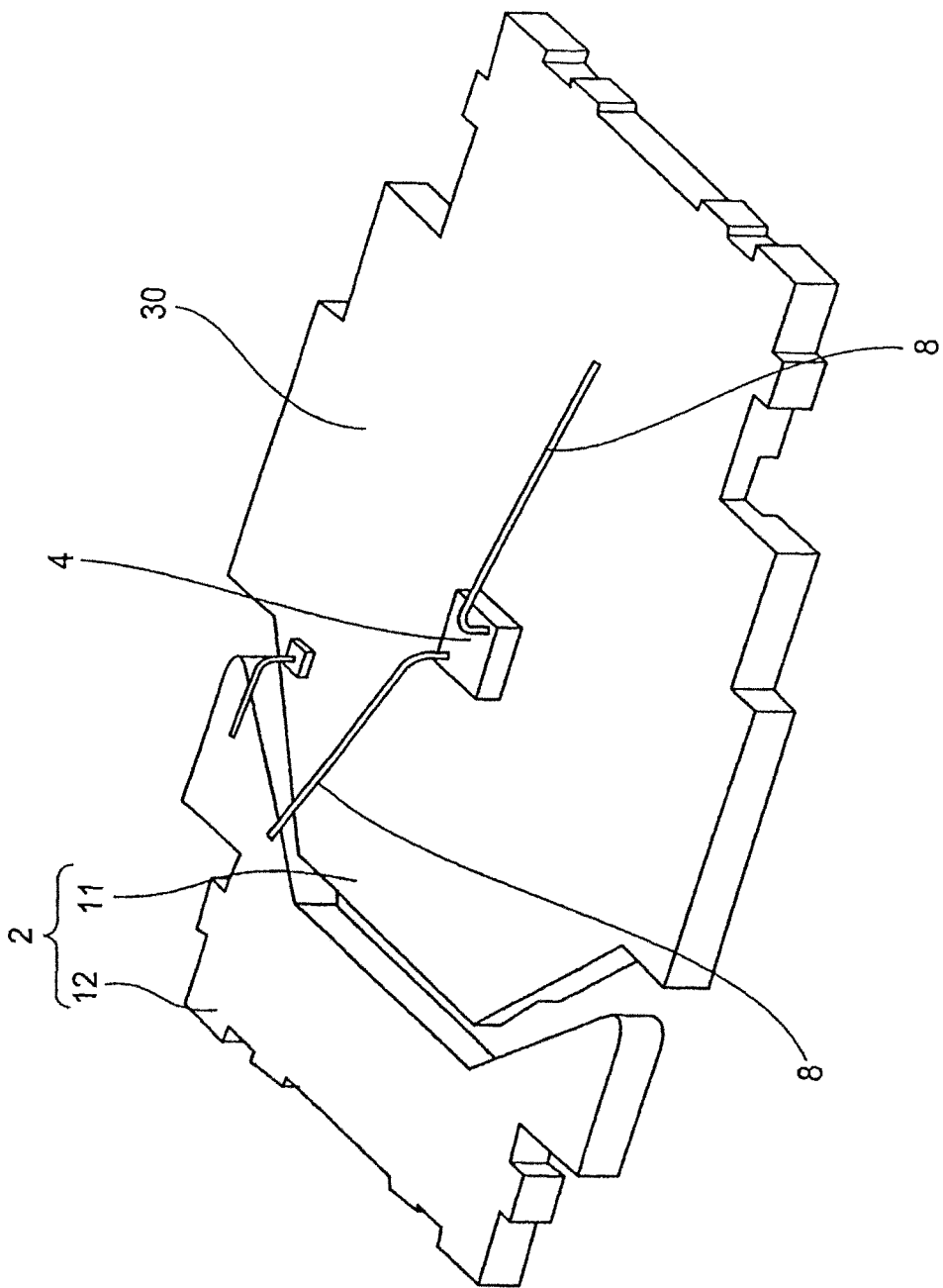
FIG. 11 is a process drawing showing a manufacturing process of the light emitting device according to an embodiment shown above, of mounting a light emitting element on the lead frame, and the lead frame and the light emitting element are electrically connected by way of wire bonding.

As shown in FIG. 11, the light emitting element 4 may be mounted on the light emitting element mounting portion 30 of the cathode 11. At mounting, a bonding member such as an epoxy resin, or a silicone resin as described above, may be used. Then, the light emitting element 4 and the cathode 11 or the anode 12 may be connected with a bonding wire 8.

(III) Forming Resin Frame

Figure 12:
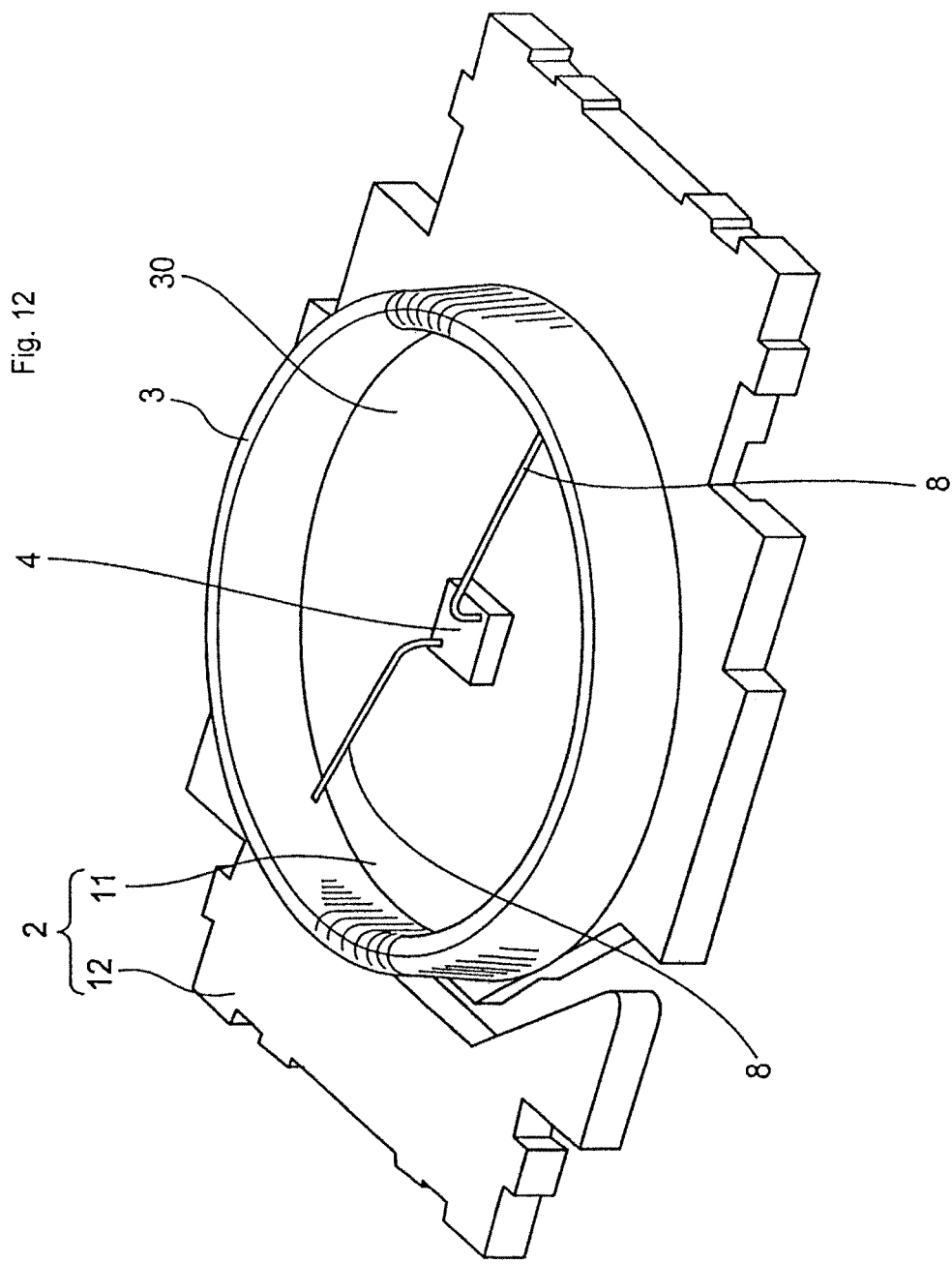
FIG. 12 is a process drawing showing a manufacturing process of the light emitting device according to an embodiment shown above, of forming a resin frame on the lead frame.

Next, as shown in FIG. 12, a raw material of the resin frame 3 may be supplied on the cathode 11 to surround the light emitting element 4, to form an uncured frame with the raw material of the resin frame 3. In the present embodiment, the molded resin 13 is not disposed between the cathode 11 and the anode 12, so that uncured frame may flow out from between the cathode 11 and the anode 12. Thus, an uncured frame is formed only on the cathode 11. That is, the uncured frame may be formed so that both the lower ends of the inner surface 20 and the outer surface 21 of the resin frame 3 are arranged only on the first lead (cathode) 11. Then, the frame may be cured to obtain the resin frame 3.

(IV) Forming First Sealing Resin

Figure 13:
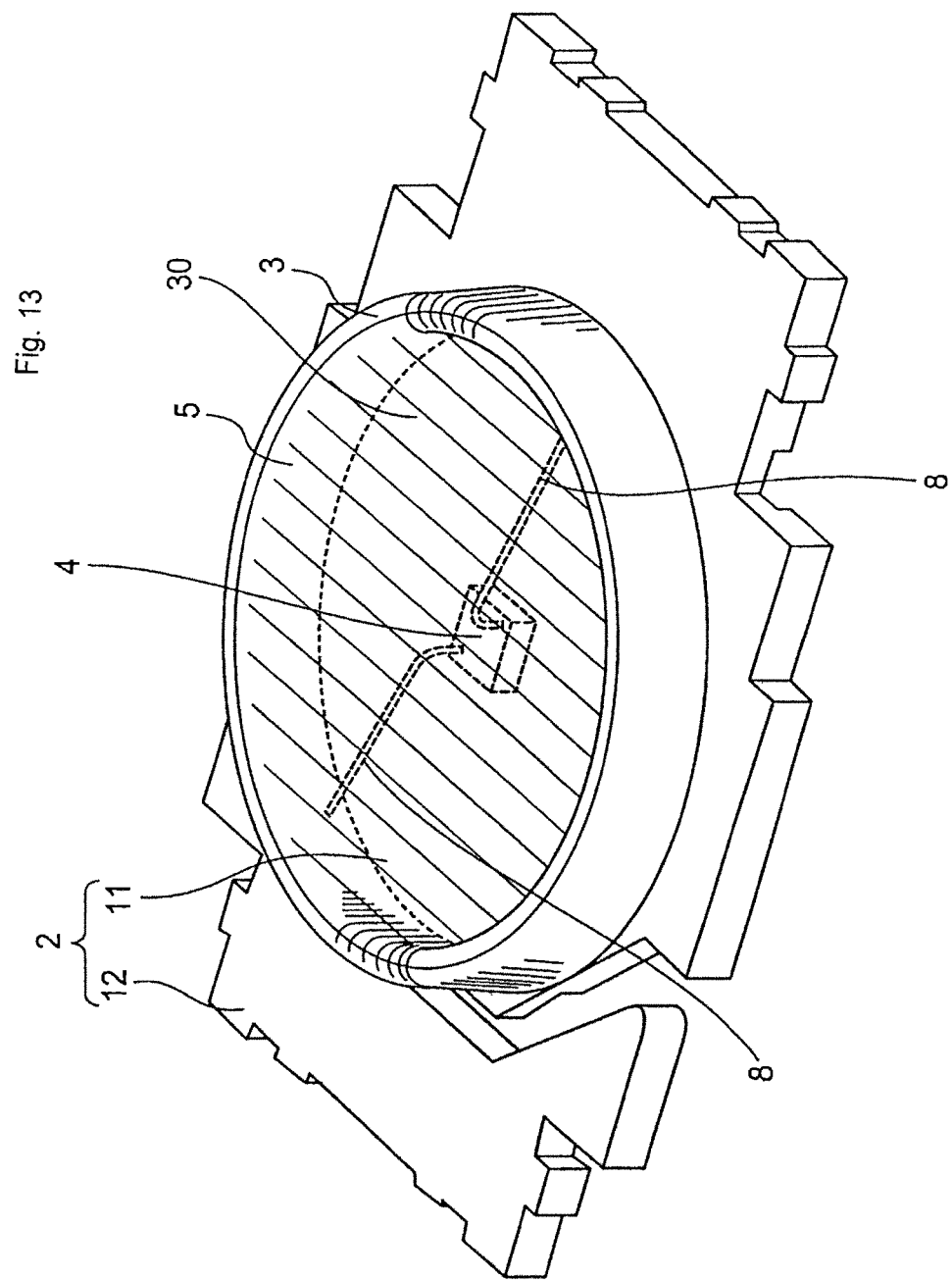
FIG. 13 is a process drawing showing a manufacturing process of the light emitting device according to an embodiment shown above, of disposing a first sealing resin by filling a sealing resin in the inner side of the resin frame and hardening.

As shown in FIG. 13, a sealing resin may be filled in the resin frame 3 and cured to form the first sealing resin 5.

(V) Forming Second Sealing Resin

Figure 14:
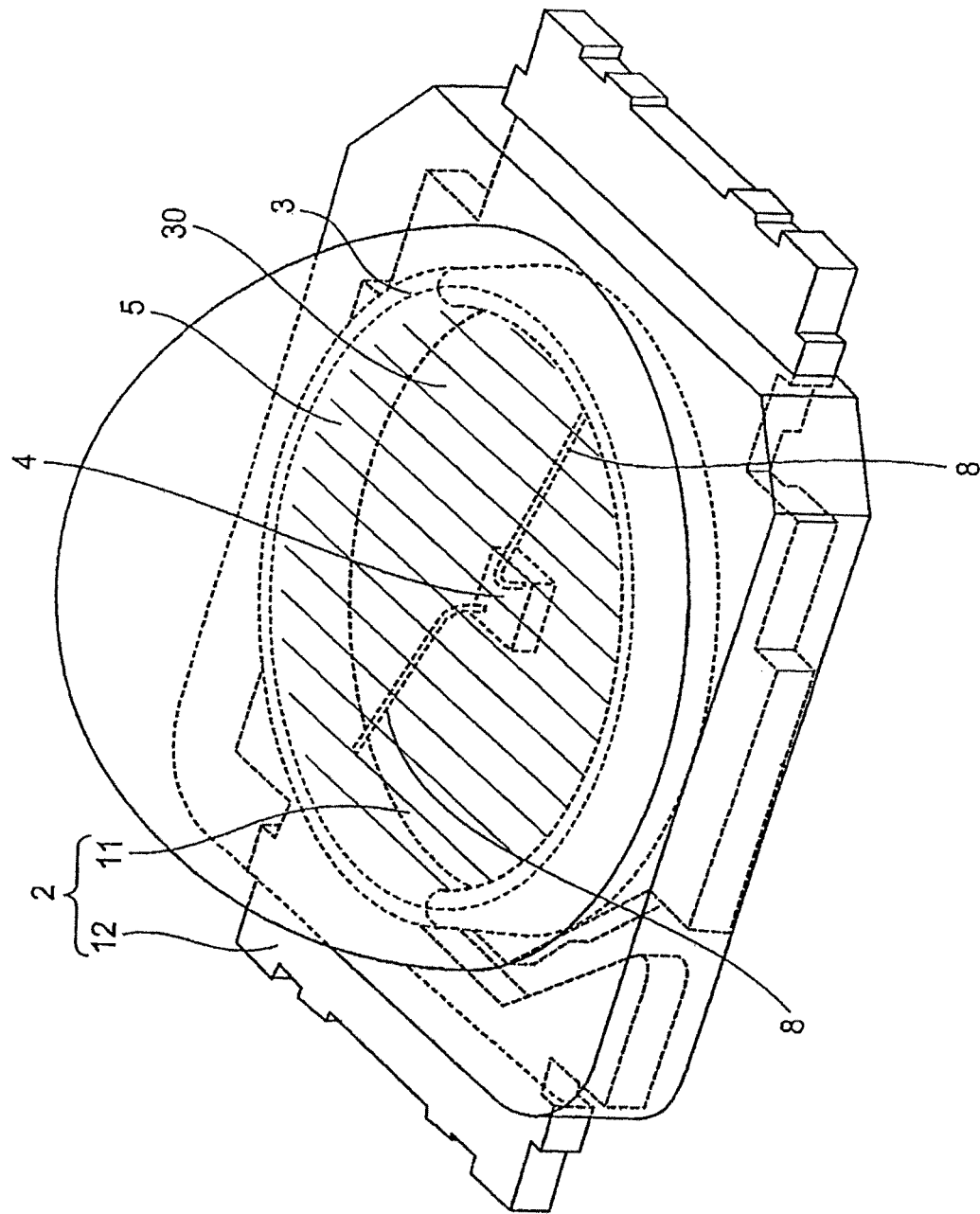
FIG. 14 is a process drawing showing a manufacturing process of the light emitting device according to an embodiment shown above, of forming a second sealing resin to cover the first sealing resin.

As shown in FIG. 14, in a similar manner as described above, the second sealing resin 6 may be formed so that the second sealing resin 6 covers the resin frame 3 and the first sealing resin 5, while respectively covering at least a part of the first lead and at least a part of the second lead 12 at outside of the resin frame 3.

Now, example embodiments of the present invention will be explained in detail below with reference to illustrative examples.

Illustrative Example 1

FIG. 9 shows an example light emitting device 1 having one light emitting element 4 and a molded resin 13 arranged between the cathode 11 and the anode 12 which constitute the lead frame 2. The lead frame 2 has a cathode 11 and the anode 12 each having a shape as shown in FIG. 4. The cathode 11 is formed larger than the anode 12 and the light emitting element 4 is mounted on the cathode 11. The lead frame 2 is made of a clad material which is a stacked layer of an alloy of Fe and Cu, an Invar (registered trademark, an alloy made of iron and 36% nickel), and an alloy of Fe and Cu. Then, Ni, Pd, and Au may be plated in this order from the bottom on the surfaces of the lead frame 2. Further, in order to increase the reflectance of the light emitting portion of the lead frame 2, a plating of Ag may be applied on the Au.

First, as shown in example FIG. 5, the molded resin 13 is disposed between the cathode 11 and the anode 12, and around the cathode 11 and around the anode 12. For the molded resin 13, a polyphthalamide (PPA) resin (an Amodel (registered trademark) in a black color) may be used. An uncured PPA resin may be arranged between the cathode 11 and the anode 12, and around the cathode 11 and around the anode 12, and then, the PPA resin may be cured to form the molded resin 13 having an example shape as shown in FIG. 5. The molded resin 13 may be arranged at locations so as not to be affected by the light from the light emitting element, so that a material of high reflectance is not needed to be employed.

Next, one light emitting element 4 may be mounted on the cathode 11. At the time of mounting the light emitting element 4 on the cathode 11, a bonding material (AuSn) may be used. An AuSn layer may be attached to the lower surface of the light emitting element 4 and may be melted with a flux coating applied on the metal (cathode 11) to bond. For the light emitting element 4, a blue light emitting LED may be used. The light emitting element 4 may have a square shape with an example side of 450 μm. Also, for the protective element 7, a Zener diode may be used, and one Zener diode may be mounted on the cathode 11. At the time of mounting the Zener diode on the cathode 11, an Ag paste may be used.

Then, using the bonding wires 8, as shown in example FIG. 6, the light emitting element 4 and the protective element 7 may be respectively electrically connected to the cathode 11 and the anode 12. For the bonding wires 8, an Au wire with a diameter of 25 μm may be used.

After wire bonding, a silicone resin which contains titanium oxide may be formed in a circular shape in a top view, and then cured to form the resin frame 3. The resin frame 3 may be formed so that the resin frame 3 surrounds one light emitting element 4, and also the protective element 7 may be arranged in the inner side of the resin frame 3. First, the lower portion of the resin frame may be formed so that the resin frame 3 has a cross-sectional shape as shown in FIG. 3, and successively the upper portion of the resin frame may be formed with a diameter slightly smaller than the diameter of the lower resin frame, and then, curing may be conducted. Thus, the resin frame 3 may be formed.

Subsequently, a silicone resin which contains a fluorescent material (YAG, LAG, and/or SCASN) and a light diffusion material may be injected to the inner side of the resin frame 3 and cured. Thus, the first sealing resin 5 is formed. Thereafter, the second sealing resin 6 which employs a silicone resin may be formed in a lens shape by way of transfer molding. First, on the lead frame 2, an upper mold defining a cavity corresponding to the shape of the second sealing resin 6 may be arranged so that the resin frame 3 and the first sealing resin 5 are covered with the portion of the mold which defines the cavity, and the lower mold may be arranged to cover the surface of the lead frame 2 where the resin frame 3 and the first sealing resin 5 are not formed. Then, as the second sealing member 6, a silicone resin may be poured into the cavity, and then cured.

As described above the light emitting device 1, such as shown in FIG. 9, which has one light emitting element and the molded resin 13 arranged between the cathode 11 and the anode 12 is produced. The light emitting device 1 according to Illustrative Example 1 includes a frame to which the first sealing resin 5 to be injected is made of a resin, which provides high flexibility, and also, the back-surface of the lead frame is exposed, thus good heat dissipating properties is observed.

Illustrative Example 2

FIG. 14 shows an example embodiment of a light emitting device 1 having one light emitting element 4, and a molded resin 13 is not arranged between the cathode 11 and the anode 12. The light emitting device according to Illustrative Example 2 has a similar configuration as in Illustrative Example 1, except that in Illustrative Example 1, the molded member 13 is arranged but in Illustrative Example 2, the molded resin 13 is not arranged.

The cathode 11 and the anode 12 each having a shape as shown in FIG. 10 may be prepared. Then, without forming the molded resin 13 between the cathode 11 and the anode 12, one light emitting element may be mounted on the cathode 11. After the above, the light emitting device may be manufactured in a similar manner as in Illustrative Example 1. In the light emitting device 1 according to Illustrative Example 2, the molded resin 13 is not provided and the resin frame 3 is formed only on the cathode 11, so that as described above, detachment of the resin frame 3 hardly occurs.

Illustrative Example 3

Figure 15:
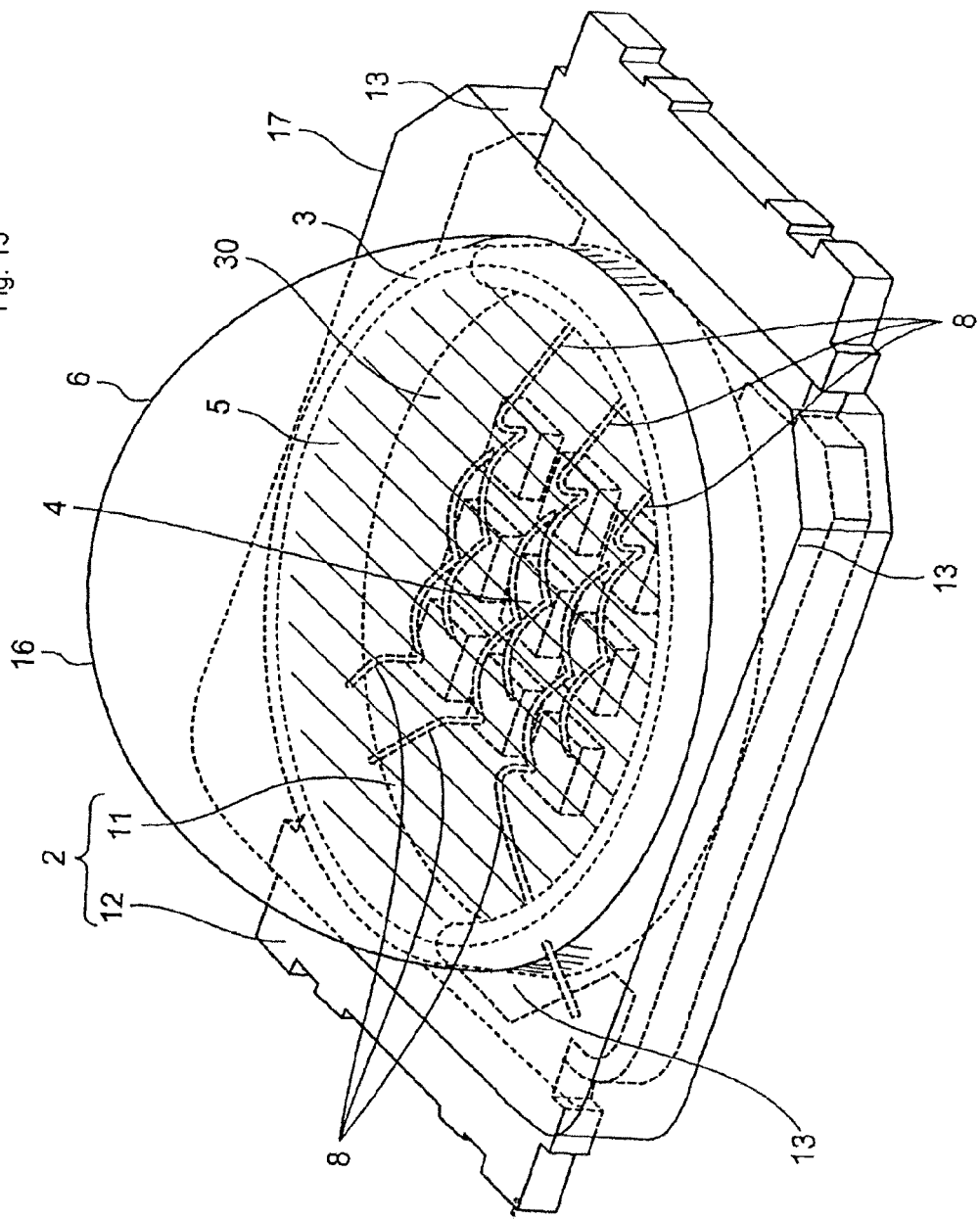
FIG. 15 is a perspective view showing an illustrative example of a light emitting device according to an illustrative example of the present invention.

FIG. 15 shows an example embodiment of a light emitting device 1 having, for example, nine light emitting elements 4 and the molded resin 13 is arranged between the cathode 11 and the anode 12. The light emitting device according to Illustrative Example 3 has a similar configuration as in Illustrative Example 1, except that in Illustrative Example 1, one light emitting element 4 is mounted, but in Illustrative Example 3, nine light emitting elements 4 are mounted in a matrix shape. Implementations of the invention are not limited to such numbers of light emitting elements, i.e., any number of light emitting elements may be included.

The cathode 11 and the anode 12 each having a shape as shown in FIG. 4 may be prepared, and in a similar manner as in Illustrative Example 1, the molded resin 13 may be formed between the cathode 11 and the anode 12. Then, nine light emitting elements 4 are disposed in a matrix shape, and as shown in FIG. 15, using the bonding wires 8, the nine light emitting elements 4 may be respectively connected to the cathode 11 and the anode 12. After the above, the light emitting device may be manufactured in a similar manner as in Illustrative Example 1.

Illustrative Example 4

Figure 16:
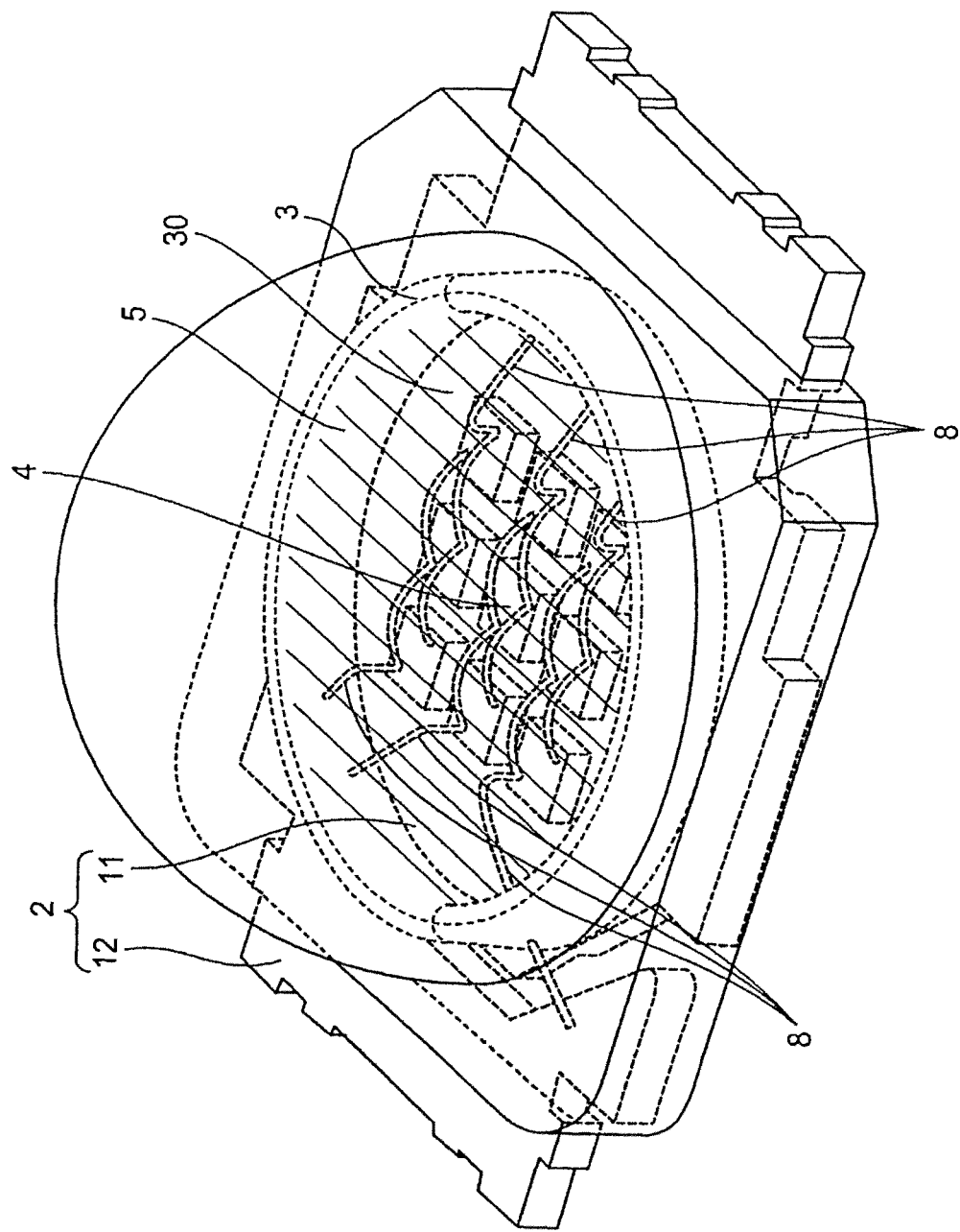
FIG. 16 is a perspective view showing an illustrative example of a light emitting device according to an illustrative example of the present invention.

FIG. 16 shows an example embodiment of a light emitting device 1 having, for example, nine light emitting elements 4, and a molded resin 13 is not arranged between the cathode 11 and the anode 12. The light emitting device according to Illustrative Example 4 has a similar configuration as in Illustrative Example 2, except that in Illustrative Example 2, one light emitting element 4 is mounted, but in Illustrative Example 4, nine light emitting elements 4 are mounted in a matrix shape. Implementations of the invention are not limited to such numbers of light emitting elements, i.e., any number of light emitting elements may be included.

The cathode 11 and the anode 12 each having a shape as shown in FIG. 10 may be prepared, and subsequently, without forming the molded resin 13 between the cathode 11 and the anode 12, nine light emitting elements 4 may be arranged in a matrix shape on the cathode 11. Then, as shown in FIG. 16, using the bonding wires 8, the nine light emitting elements 4 may be respectively connected to the cathode 11 and the anode 12. After the above, the light emitting device may be manufactured in a similar manner as in Illustrative Example 2. As illustrated above, example embodiments are described to give a concrete form to technical ideas of a method of manufacturing light emitting element according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A method of manufacturing a light emitting device, the method comprising:
   providing a planar lead frame having a first lead and a second lead;
   mounting a light emitting element on the first lead;
   electrically connecting the light emitting element to the first lead and the second lead;
   forming a resin frame surrounding the light emitting element so that a lower end of an inner surface of the resin frame is located only on the first lead; and
   filling a first sealing resin in an inner side of the resin frame and sealing the light emitting element with the first sealing resin,
   wherein the light emitting element and the lead frame are connected with a bonding wire, and wherein the resin frame is formed by discharging a raw material of the resin frame over and across the bonding wire, and curing the raw material.

2. The method of manufacturing a light emitting device according to claim 1, the method further comprising disposing a second sealing resin to cover the resin frame and the first sealing resin, and at an outer side of the resin frame, to cover at least a part of the first lead and at least a part of the second lead.

3. The method of manufacturing a light emitting device according to claim 1, wherein the resin frame is formed so that a lower end of the outer surface of the resin frame is located on the first lead.

4. The method of manufacturing a light emitting device according to claim 1, further comprising arranging a molded resin between the first lead and the second lead.

5. The method of manufacturing a light emitting device according to claim 4, wherein the resin frame is formed so as to be positioned on a boundary between the molded resin and the first lead.

6. The method of manufacturing a light emitting device according to claim 1, wherein the resin frame is formed by supplying a raw material of the resin frame on the lead frame by a dispenser.

7. The method of manufacturing a light emitting device according to claim 1, wherein the resin frame is formed by disposing a first level of resin frame on the first lead, and then disposing a second level of resin frame with a smaller diameter than the first level of the resin frame on the first level of the resin frame.

8. The method of manufacturing a light emitting device according to claim 1, wherein the first sealing resin is filled so as to have same height as the height of the resin frame.

9. The method of manufacturing a light emitting device according to claim 1, wherein the second sealing resin is formed using a mold.

10. The method of manufacturing a light emitting device according to claim 1, wherein the resin frame contains titanium oxide.

11. The method of manufacturing a light emitting device according to claim 1, wherein the first sealing resin contains silicone.

12. The method of manufacturing a light emitting device according to claim 1, wherein the first sealing resin contains a wavelength converting member.

13. The method of manufacturing a light emitting device according to claim 1, wherein the wavelength converting member is deposited in a layer on the upper surface of the light emitting element and on the upper surface of the first lead.

14. The method of manufacturing a light emitting device according to claim 1, wherein the second sealing resin contains silicone.

15. A method of manufacturing a light emitting device, the method comprising:
    providing a planar lead frame having a first lead and a second lead;
    mounting a light emitting element on the first lead;
    electrically connecting the light emitting element to the first lead and the second lead;
    forming a resin frame surrounding the light emitting element so that a lower end of an inner surface of the resin frame is located only on the first lead; and
    filling a first sealing resin in an inner side of the resin frame and sealing the light emitting element with the first sealing resin,
    wherein the resin frame is formed by disposing a first level of resin frame on the first lead, and then disposing a second level of resin frame with a smaller diameter than the first level of the resin frame on the first level of the resin frame.

16. The method of manufacturing a light emitting device according to claim 15, further comprising arranging a molded resin between the first lead and the second lead.

17. The method of manufacturing a light emitting device according to claim 16, wherein the resin frame is formed so as to be positioned on a boundary between the molded resin and the first lead.

18. The method of manufacturing a light emitting device according to claim 15, wherein the resin frame is formed by supplying a raw material of the resin frame on the lead frame by a dispenser.

19. The method of manufacturing a light emitting device according to claim 15, wherein the resin frame contains titanium oxide.

20. The method of manufacturing a light emitting device according to claim 15, wherein the first sealing resin contains a wavelength converting member.

* * * * *

UNITED STATES PATENT AND TRADEMARK OFFICE
CERTIFICATE OF CORRECTION

PATENT NO.         : 9,634,213 B2
APPLICATION NO.    : 14/855030
DATED              : April 25, 2017
INVENTOR(S)        : Hiroaki Ukawa It is certified that error appears in the above-identified patent and that said Letters Patent is hereby corrected as shown below:

In the Claims

Column 20, Line 17:
Please replace "so as to have same height as the height of the resin frame." with --so as to have a same height as the height of the resin frame.--.

Signed and Sealed this
Twenty-fifth Day of July, 2017

Joseph Matal
*Performing the Functions and Duties of the
Under Secretary of Commerce for Intellectual Property and
Director of the United States Patent and Trademark Office*